(12) United States Patent
Kwon et al.

(10) Patent No.: US 12,405,683 B2
(45) Date of Patent: Sep. 2, 2025

(54) DISPLAY DEVICE HAVING A RESIN PATTERN DISPOSED THEREIN

(71) Applicant: Samsung Display Co., LTD., Yongin-si (KR)

(72) Inventors: Seung Wook Kwon, Hwaseong-si (KR); Seo Yeon Lee, Namyangju-si (KR); Seung Gun Chae, Hwaseong-si (KR); Sang Tae Ahn, Cheonan-si (KR); Seung Yeon Chae, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 610 days.

(21) Appl. No.: 17/705,947

(22) Filed: Mar. 28, 2022

(65) Prior Publication Data
US 2023/0032393 A1    Feb. 2, 2023

(30) Foreign Application Priority Data
Jul. 30, 2021    (KR) .......................... 10-2021-0100318

(51) Int. Cl.
*G06F 3/041* (2006.01)
*H10K 50/842* (2023.01)
(Continued)

(52) U.S. Cl.
CPC ....... *G06F 3/0412* (2013.01); *H10K 50/8426* (2023.02); *H10K 50/844* (2023.02);
(Continued)

(58) Field of Classification Search
CPC .. H10K 59/40; H10K 50/8426; H10K 50/844; G06F 1/1643; G06F 3/0445; G06F 3/0412
See application file for complete search history.

(56) References Cited

U.S. PATENT DOCUMENTS

| | | |
|---|---|---|
| 9,735,398 B2 | 8/2017 | Aoyama et al. |
| 10,164,219 B2 | 12/2018 | Aoyama et al. |

(Continued)

FOREIGN PATENT DOCUMENTS

| | | |
|---|---|---|
| KR | 10-2009-0132564 | 12/2009 |
| KR | 10-2016-0040513 | 4/2016 |

(Continued)

*Primary Examiner* — Khiem D Nguyen
(74) *Attorney, Agent, or Firm* — Womble Bond Dickinson (US) LLP

(57) ABSTRACT

A display device includes, a display panel including a light-emitting element layer disposed on a substrate, a thin-film encapsulation layer disposed on the light-emitting element layer, a touch electrode layer disposed on the thin-film encapsulation layer, a display area, the light-emitting element layer being located in the display area, and a non-display area disposed around the display area, and a resin pattern disposed on and directly contacting the touch electrode layer. The non-display area includes a first non-display area disposed around the display area, and a second non-display area spaced apart from the display area, the first non-display area being disposed between the display area and the second non-display area in a plan view. The resin pattern is disposed in the second non-display area in a plan view.

10 Claims, 37 Drawing Sheets

(51) Int. Cl.
*H10K 50/844* (2023.01)
*H10K 59/40* (2023.01)
*H10K 71/00* (2023.01)
*H10K 59/80* (2023.01)

(52) U.S. Cl.
CPC ............ *H10K 59/40* (2023.02); *H10K 71/00* (2023.02); *H10K 59/873* (2023.02)

(56) References Cited

U.S. PATENT DOCUMENTS

| | | | |
|---|---|---|---|
| 10,290,685 B2* | 5/2019 | Oh | G06F 3/0412 |
| 10,800,936 B2 | 10/2020 | Landa et al. | |
| 11,201,194 B2* | 12/2021 | Noh | H04R 1/288 |
| 2017/0331071 A1* | 11/2017 | Han | G02B 5/0284 |
| 2019/0091970 A1 | 3/2019 | Ueki et al. | |
| 2019/0348475 A1* | 11/2019 | Park | H10K 59/88 |
| 2020/0124910 A1* | 4/2020 | Hwang | G02F 1/136209 |
| 2020/0312932 A1* | 10/2020 | Kim | H01L 27/124 |
| 2021/0210582 A1* | 7/2021 | Lee | H04M 1/0266 |
| 2023/0121461 A1* | 4/2023 | Jiang | G06F 1/1605 |
| | | | 257/40 |

FOREIGN PATENT DOCUMENTS

| | | |
|---|---|---|
| KR | 10-2019-0006183 | 1/2019 |
| KR | 10-2021-0052725 | 5/2021 |

* cited by examiner

MG: MG_1, MG_2

DISPLAY DEVICE HAVING A RESIN PATTERN DISPOSED THEREIN

CROSS-REFERENCE TO RELATED APPLICATION(S)

This application claims priority to and benefits of Korean Patent Application No. 10-2021-0100318 under 35 U.S.C. § 119, filed on Jul. 30, 2021, in the Korean Intellectual Property Office, the entire contents of which are incorporated herein by reference.

BACKGROUND

1. Technical Field

The disclosure relates to a flexible display device and a method for manufacturing the flexible display device.

2. Description of the Related Art

Importance of display devices is increasing due to the development of multimedia applications and content. In response to this increase, various types of the display devices such as an organic light-emitting display device (OLED), and a liquid crystal display device (LCD) are being used.

Recently, research and development on display devices having flexible displays is being actively conducted. Flexible displays may extend or reduce a display screen by folding, bending, or sliding the display screen, thereby reducing the volume of the display device or changing its design.

The display device may be manufactured by performing a process on a mother substrate including multiple cells corresponding to each display device to obtain the cells, and performing a process on the obtained cell on a module-by-module basis. In order to prevent physical and chemical scratches that may occur during when the cell is transferred from the process on the mother substrate to the module-based processes, the cell is transferred with a top protective film is formed on a cell surface.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A purpose of the disclosure is to provide a display device in which the top protective film is selectively coated only on a portion requiring the coating, thereby reducing a cost of a material for forming the top protective film.

A purpose of the disclosure is to provide a method for manufacturing a display device in which the top protective film is selectively coated only on a portion requiring the coating thereof, thereby reducing a cost of a material for forming the top protective film. Purposes according to the disclosure are not limited to the above-mentioned purposes. Other purposes and advantages according to the disclosure that are not mentioned may be understood based on following descriptions, and may be more clearly understood based on embodiments according to the disclosure. Further, it will be understood that the purposes and advantages according to the disclosure may be realized using means shown in the claims and combinations thereof.

According to an embodiment of the disclosure, a display device may comprise a display panel including a light-emitting element layer disposed on a substrate, a thin-film encapsulation layer disposed on the light-emitting element layer, a touch electrode layer disposed on the thin-film encapsulation layer, a display area, the light-emitting layer being located in the display area in a plan view, and a non-display area disposed around the display area in a plan view, and a resin pattern disposed on the touch electrode layer, the resin pattern including an ultraviolet ray (UV)-curable material. The non-display area may include a first non-display area around the display area in a plan view, and a second non-display area spaced apart from the display area, the first non-display area being disposed between the display area and the second non-display area in a plan view. The resin pattern may be disposed in the second non-display area in a plan view.

In an embodiment, the touch electrode layer may include a first touch conductive layer disposed on the thin-film encapsulation layer, a touch insulating layer disposed on the first touch conductive layer, a second touch conductive layer disposed on the touch insulating layer, and a touch protective layer disposed on the second touch conductive layer. The resin pattern may be disposed directly on the touch protective layer.

In an embodiment, an adhesion between the touch protective layer and the resin pattern may be in a range of about 3 gf/inch$^2$ to about 5 gf/inch$^2$.

In an embodiment, the device may further comprise a polarization member disposed on the touch protective layer, a window cover disposed on the polarization member, and an adhesive layer disposed between the window cover and the polarization member, the adhesive layer attaching the window cover to the polarization member. The resin pattern may be disposed between the touch protective layer and the polarization member. The adhesive layer may include an UV-curable material. An adhesion between the adhesive layer and the polarization member may be greater than the adhesion between the touch protective layer and the resin pattern.

In an embodiment, the second non-display area may extend about 300 μm from an edge of the display panel.

In an embodiment, the resin pattern may overlap the thin-film encapsulation layer and the touch electrode layer. The resin pattern may not overlap the light-emitting element layer.

According to an embodiment of the disclosure, a display device may comprise a display panel including a circuit layer disposed on a substrate, a light-emitting element layer disposed on the circuit layer, a thin-film encapsulation layer disposed on the light-emitting element layer, a display area, the light-emitting layer being located in the display area in a plan view, and a non-display area disposed around the display area in a plan view, and a resin pattern disposed on and directly contacting the thin-film encapsulation layer. The non-display area may include a first non-display area arranged around the display area in a plan view, and a second non-display area spaced apart from the display area, the first non-display area being disposed between the second non-display area and the display area in a plan view. The resin pattern may be disposed in the second non-display area.

In an embodiment, the thin-film encapsulation layer may include a first inorganic layer disposed on the light-emitting element layer, an organic layer disposed on the first inorganic layer, and a second inorganic layer disposed on the organic layer. The resin pattern may be disposed directly on the second inorganic layer.

In an embodiment, the resin pattern may overlap the circuit layer, and the thin-film encapsulation layer in a plan view. The resin pattern may not overlap the light-emitting element layer in a plan view.

According to an embodiment of the disclosure, a method for manufacturing a display device may comprise providing a mother substrate including a first area including cell areas and a second area disposed around the first area, forming a mother display panel on the first area of the mother substrate, forming a first bump in the second area of the mother substrate, after forming the first bump, applying an ultraviolet ray (UV)-curable resin on the mother display panel, curing the ultraviolet ray (UV)-curable resin applied on the mother display panel to form a top protective film, and separating the mother substrate from the mother display panel and the top protective film.

In an embodiment, the first bump may be spaced from the mother display panel in a plan view and may expose a portion of a face of the mother substrate. The top protective film may connect the mother display panel and the first bump to each other, and the top protective film may cover the exposed portion of the face of the mother substrate.

In an embodiment, the first bump may surround the first area in a plan view.

In an embodiment, the forming of the first bump may further include forming a foam layer on the second area of the mother substrate. The separating of the mother substrate from the mother display panel and the top protective film may include inserting a releasing knife into between the mother substrate and the foam layer.

In an embodiment, the separating of the mother substrate from the mother display panel and the top protective film may include inserting a releasing knife between the first bump and the mother substrate and between the top protective film and the mother substrate.

In an embodiment, a side face of a portion of the top protective film adjacent to the first bump has an inclination angle in a range of about 5° to about 50° with respect to the mother substrate.

In an embodiment, each of an adhesion between the top protective film and the mother substrate and an adhesion between the first bump and the mother substrate is in a range of about 3 gf/inch$^2$ to about 10 gf/inch$^2$. An adhesion between the mother display panel and the mother substrate is smaller than or equal to about 0.1 gf/inch$^2$.

In an embodiment, the separating of the mother substrate from the mother display panel and the top protective film may further include separating the first bump from the top protective film and the mother substrate, and inserting the releasing knife between the top protective film and the mother substrate.

In an embodiment, the applying of the ultraviolet ray (UV)-curable resin includes applying the ultraviolet ray (UV)-curable resin using an inkjet. The mother display panel may include a display panels respectively overlapping the cell areas in a plan view. The ultraviolet ray (UV)-curable resin may be selectively applied onto the display panels.

In an embodiment, the method for manufacturing a display device may further comprise forming a second bump on the display panels.

In an embodiment, the method for manufacturing a display device may further comprise scribing the mother display panel to obtain the display panel after the separating of the mother substrate from the mother display panel and the top protective film, and separating the top protective film from the display panel. The separating of the top protective film from the display panel may include attaching a tape to the second bump and the top protective film, and removing the tape to remove together the second bump and the top protective film from the display panel.

The display device according to an embodiment of the disclosure may reduce a material cost for forming the top protective film.

The method for manufacturing the display device according to an embodiment of the disclosure may reduce a material cost for forming the top protective film.

Effects of the disclosure are not limited to the above-mentioned effects, and other effects as not mentioned will be clearly understood by those skilled in the art from following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
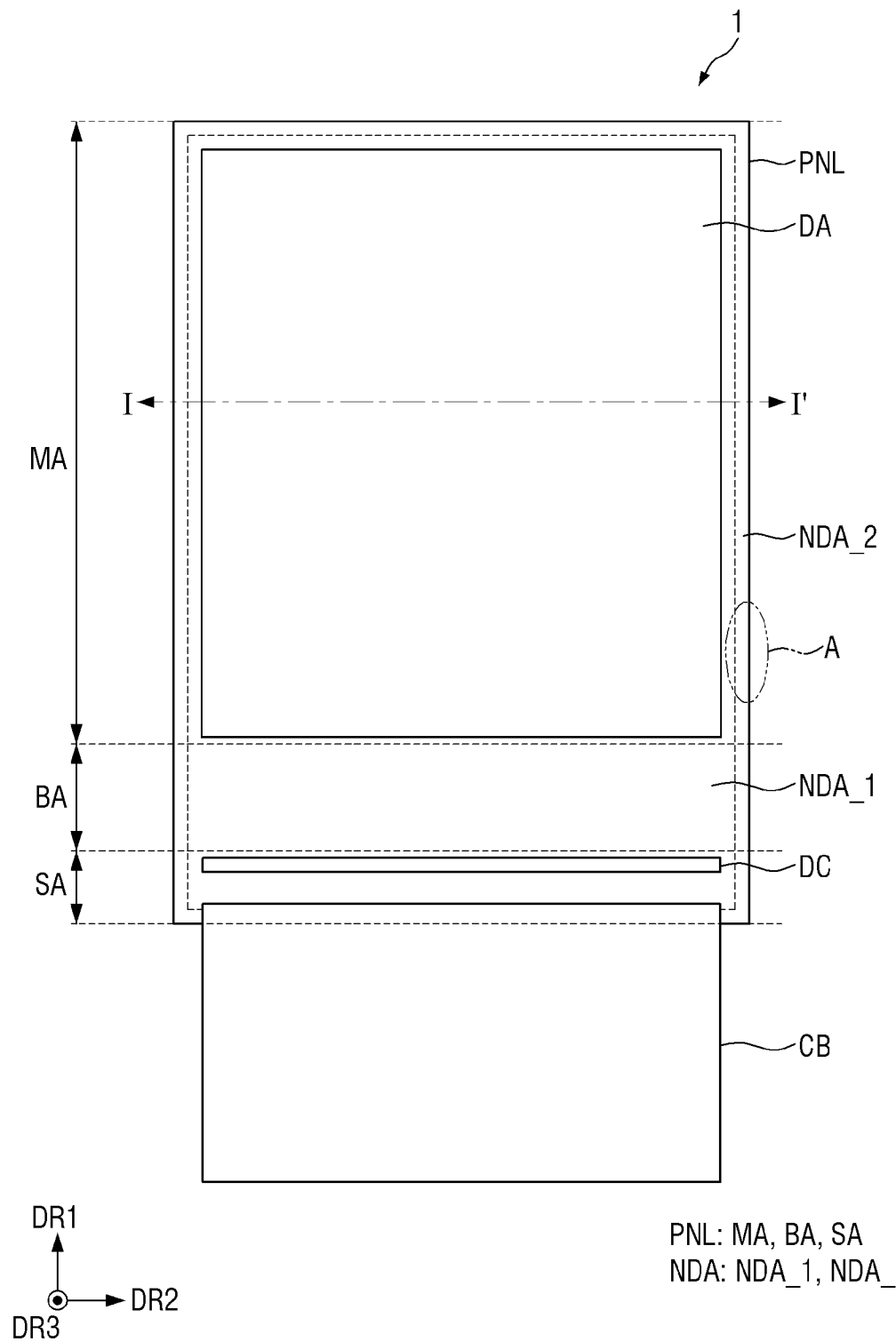
FIG. 1 is a schematic plan view of a display device according to an embodiment.

The disclosure will now be described more fully hereinafter with reference to the accompanying drawings, in which embodiments may be shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

It will be understood that when an element (or a region, a layer, a portion, or the like) is referred to as "being on," "connected to," or "coupled to" another element in the specification, it can be directly disposed on, connected or coupled to another element mentioned above, or intervening elements may be disposed therebetween.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 2:
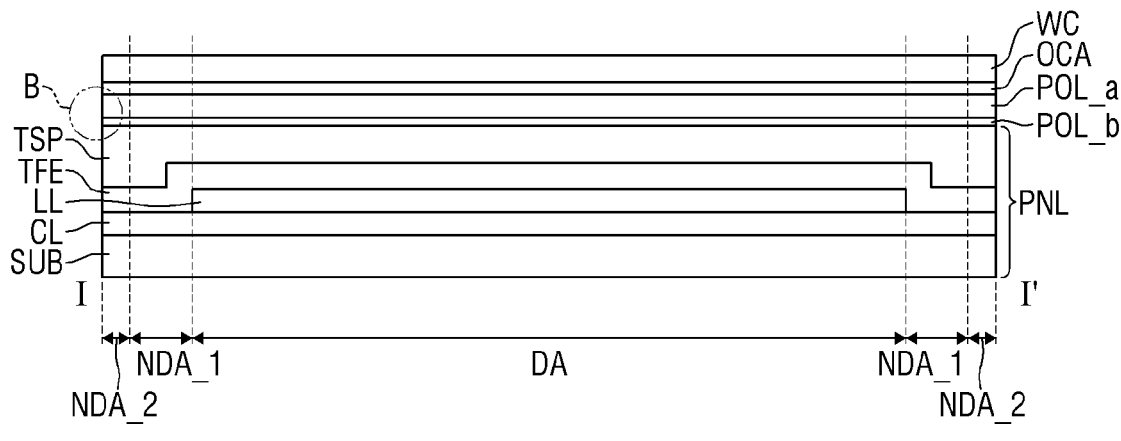
FIG. 2 is a schematic cross-sectional view showing the display device according to the embodiment of FIG. 1 as cut along a line I-I'.
Figure 2:
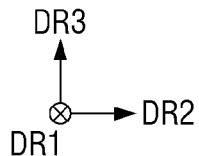
Figure 3:
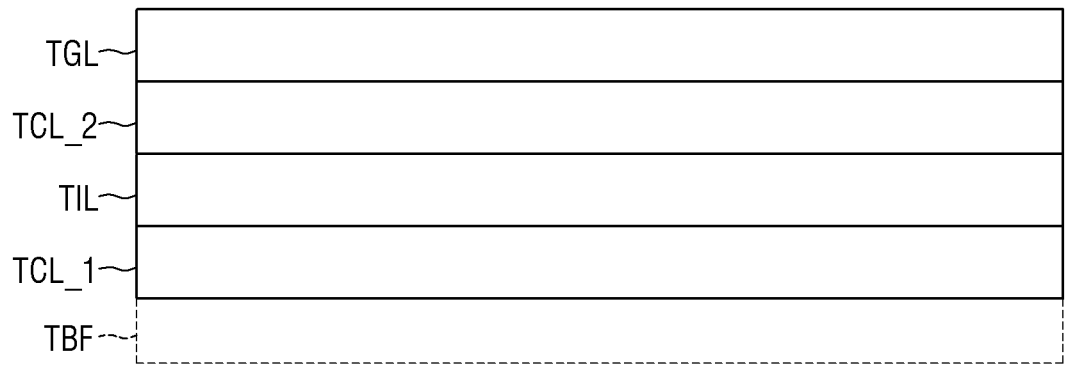
FIG. 3 is a structure diagram showing a structure of a touch electrode layer of FIG. 2.
Figure 3:
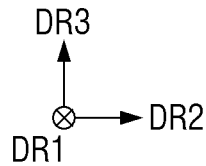
Figure 4:
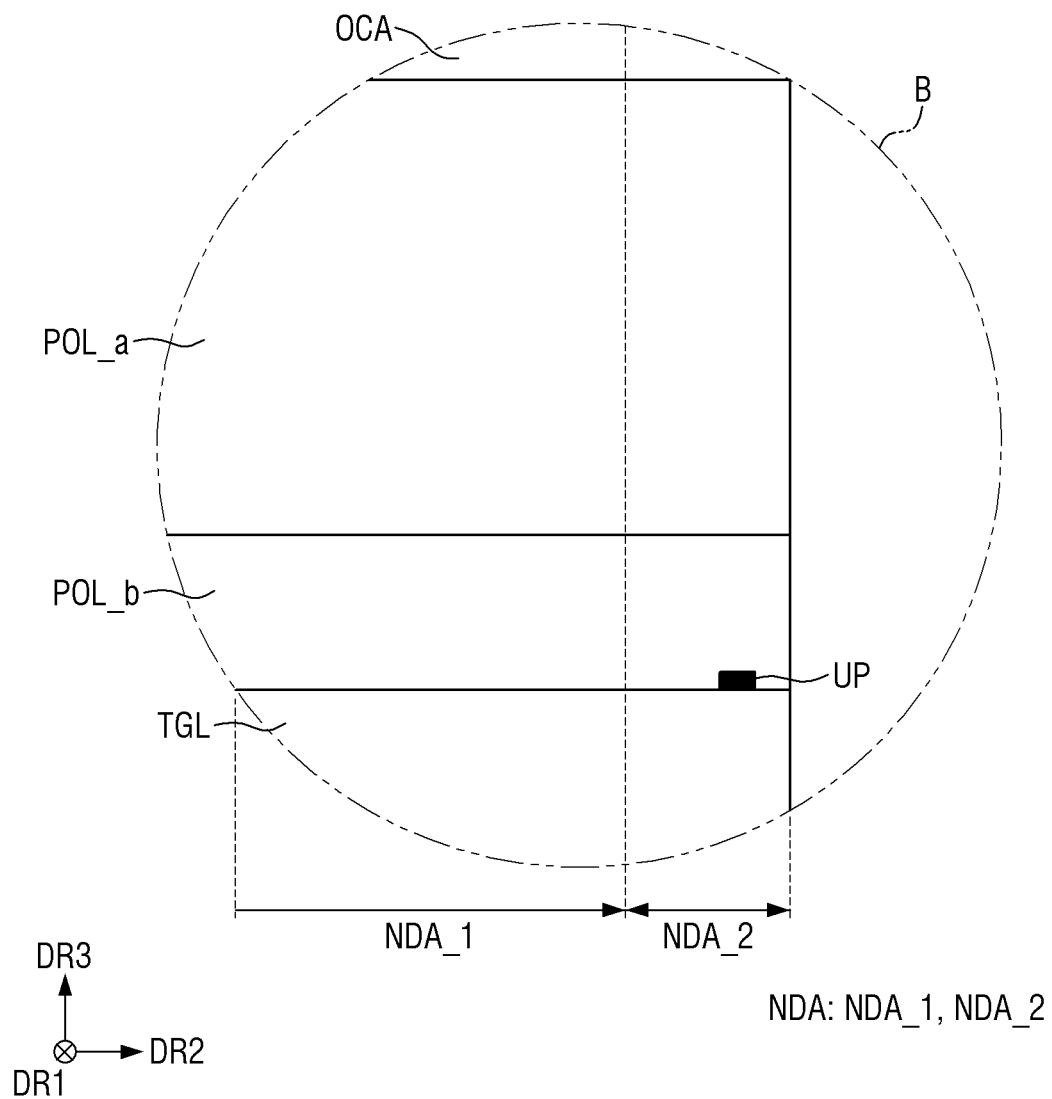
FIG. 4 is an enlarged schematic view of an area B in FIG. 2.
Figure 5:
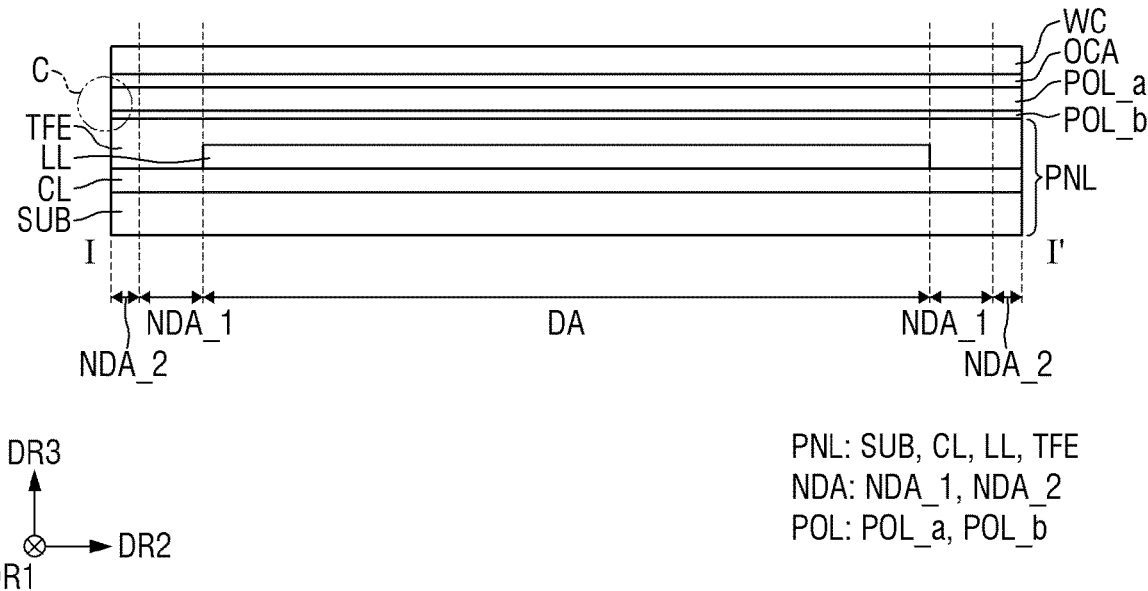
FIG. 5 is a schematic cross-sectional view as cut along a line I-I' of the display device according to the embodiment of FIG. 1 in which the touch electrode layer is omitted.
Figure 6:
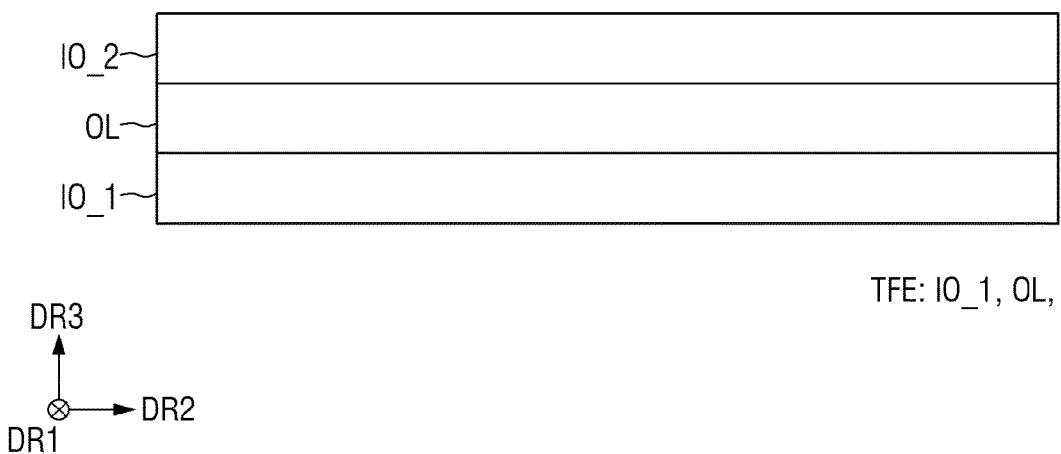
FIG. 6 is a structure diagram showing a structure of a thin-film encapsulation layer of FIG. 5.
Figure 7:
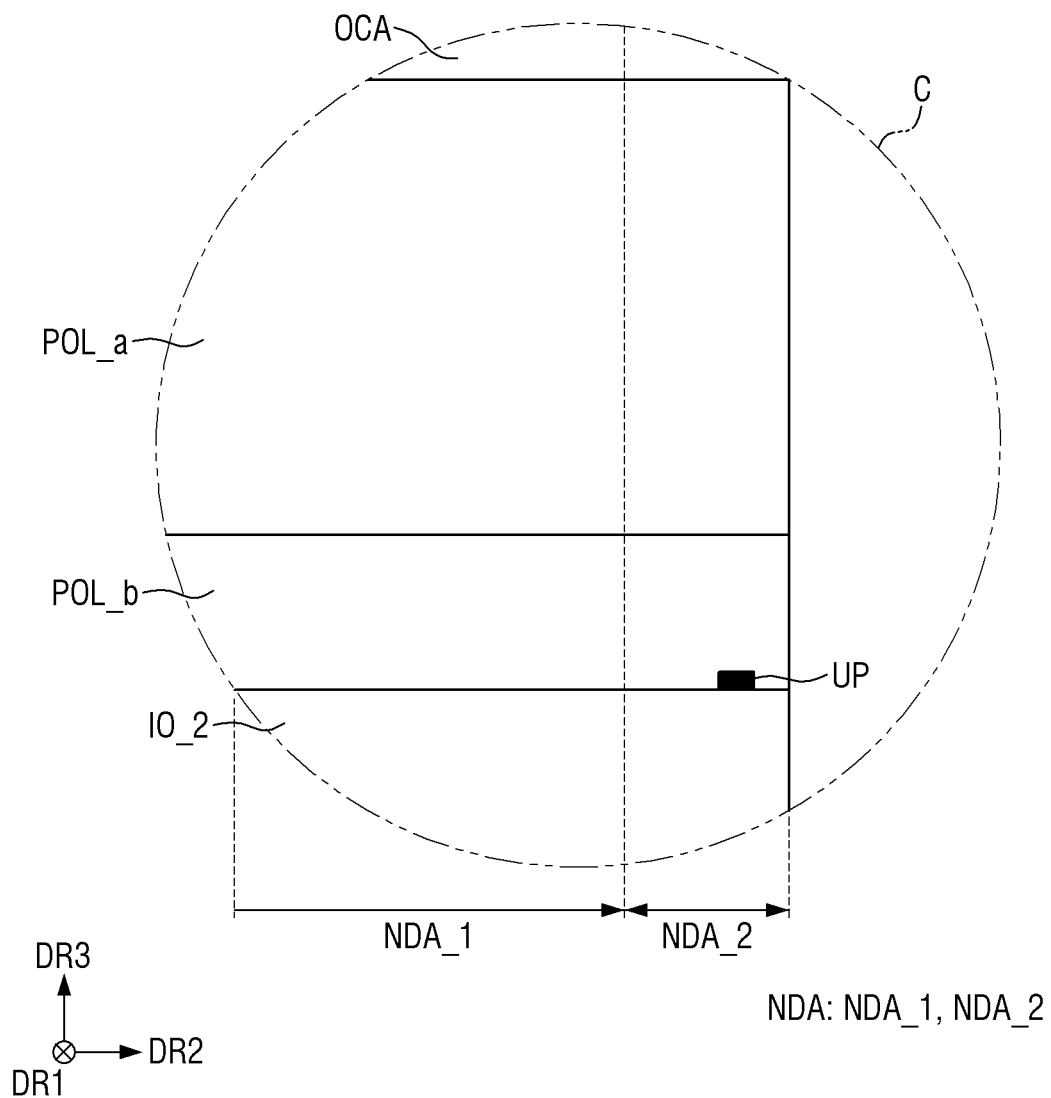
FIG. 7 is an enlarged schematic view of an area C of FIG. 5.
Figure 8:
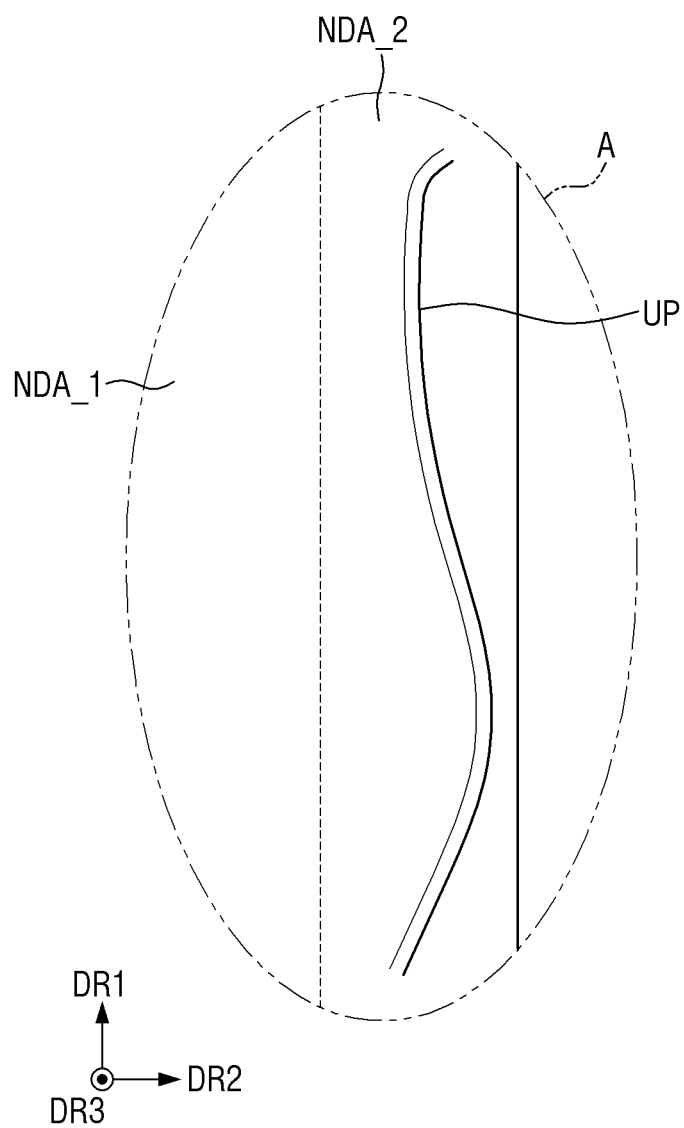
FIG. 8 is an enlarged schematic view of an area A of FIG. 1.

FIG. 1 is a schematic plan view of a display device according to an embodiment. FIG. 2 is a schematic cross-sectional view showing the display device according to the embodiment of FIG. 1 as cut along a line I-I'. FIG. 3 is a structure diagram showing a touch electrode layer of FIG. 2. FIG. 4 is an enlarged schematic view of an area B in FIG. 2. FIG. 5 is a schematic cross-sectional view as cut along a line I-I' of the display device according to the embodiment of FIG. 1 in which the touch electrode layer is omitted. FIG. 6 is a structure diagram showing a thin-film encapsulation layer of FIG. 5. FIG. 7 is an enlarged schematic view of an area C of FIG. 5. FIG. 8 is an enlarged schematic view of an area A of FIG. 1.

Referring to FIG. 1, a display device 1 according to an embodiment may a device that displays moving images or still images, and may be used as a display screen of each of not only portable electronic devices such as tablet PCs, smart phones, mobile communication terminals, and e-books, but also various products such as televisions, laptops, and monitors.

The display device 1 has a three-dimensional shape. In the drawing, a direction parallel to a first side (a vertical side) of the display device 1 is indicated as a first direction DR1, a direction parallel to a second side (a horizontal side) of a display panel PNL is indicated as a second direction DR2, and a thickness direction of the display device 1 is indicated as a third direction DR3. In following descriptions, a "direction" may refer to both directions respectively toward one side and the opposite side in the direction unless otherwise specified. Further, when it is necessary to distinguish the directions respectively toward a side and the opposite side in the direction from each other, a side will be referred to as a "direction toward a side" and the other thereof will be referred to as a "direction toward the opposite side." Referring to FIG. 1, a direction in which an arrow is directed is referred to as a direction toward a side, and an opposite direction is referred to as the opposite side. The first direction DR1 to the third direction DR3 may intersect each other or may be orthogonal to each other. The display device 1 may have a shape in which the vertical side is longer than the horizontal side as shown in FIG. 1. The disclosure is not limited thereto.

The display device 1 according to an embodiment may include the display panel PNL.

The display panel PNL may be a panel that displays a screen, and may include any kind of a display panel such as an organic light-emitting display panel including an organic light-emitting layer, a micro LED display panel using a micro LED, and a quantum dot light-emitting display panel using a quantum dot light-emitting diode, or an inorganic light-emitting display panel using an inorganic light-emitting element including an inorganic semiconductor. Referring to FIG. 1, the display panel PNL may display the screen toward a side in the third direction DR3.

Referring back to FIG. 1, the display panel PNL may include a main area MA, a sub-area SR disposed at a side in the first direction DR1 around the main area MA, and a bendable area BA disposed between the main area MA and the sub-area SR.

The main area MA may have a general shape similar to the planar shape of the display device 1. The main area MA may be a flat area disposed on a plane. However, the disclosure is not limited thereto. At least one of the edges of the main area MA except for a side connected to the bendable area BA may have a curved surface or may be bent in a perpendicular manner to the flat area thereof.

The bendable area BA may be connected to the opposite side in the first direction DR1 of the main area MA. For example, the bendable area BA may be connected to a short side of the main area MA. In some embodiments, the width in the second direction DR2 of the bendable area BA and the width in the second direction DR2 (hereinafter, referred to as 'short side') of the main area MA may be equal to each other. However, the disclosure is not limited thereto. For example, the width in the second direction DR2 of the bendable area BA may be smaller than a size of the short side of the main area MA. For example, a connective portion of the main area MA and the bendable area BA may have an L-shape.

In the bendable area BA, the display panel PNL may be bent toward the opposite side in the third direction DR3 and to have a curvature. Although the bendable area BA may have a certain radius of curvature, the disclosure is not limited thereto. The bendable area BA may have different radius of curvatures based on different sections thereof. As the display panel PNL is bent in the bendable area BA, a face and the opposite face of the display panel PNL are flipped. For example, before the bendable area BA is bent, a face of the sub-area SR may face toward the third direction DR3. When the bendable area BA is bent toward the opposite side in the third direction DR3, the face of the sub-area SR may face toward the opposite side in the third direction DR3. The sub-area SR may be disposed on the opposite side in the third direction DR3 of the display panel PNL and overlap the main area MA of the display panel PNL.

The sub-area SR extends from the bendable area BA. The sub-area SR may extend from a point at which bending of the bendable area BA is terminated, and in a direction parallel to the main area MA. The sub-area SR may overlap the main area MA in the third direction DR3. The sub-area SR may overlap a non-display area NDA of an edge of the main area MA, and further overlap a display area DA of the main area MA.

The width in the second direction DR2 of the sub-area SR may be equal to the width in the second direction DR2 of the bendable area BA. However, the disclosure is not limited thereto.

Pads that are electrically connected to a driver circuit DC, and a circuit board CB described below may be disposed in the sub-area SR.

Each of the driver circuit DC and the circuit board CB may output signals and voltages to operating the display panel PNL. The driver circuit DC and the circuit board CB may be electrically connected to the pads of the sub-area SA to supply a drive signal to the display panel PNL. The driver circuit DC may be implemented as an integrated circuit, and the circuit board CB may embodied as be a flexible printed circuit board CB, a printed circuit board CB, or the like.

The display panel PNL may include the display area DA that displays an image and a non-display area NDA that does not display a screen. The display area DA of the display panel PNL is disposed within the main area MA. The display area DA may be positioned in an inner region excluding an edge region of the main area MA.

The display area DA may occupy an inner region of the main area MA and may have a rectangular shape or a rectangular shape with rounded corners. However, the disclosure is not limited thereto. The display area DA may have various shapes such as a square or other polygons, or a circle or an ellipse. Pixels included in a light-emitting element layer LL to be described later may be disposed in the display area DA.

The edge region of the display area DA may be the non-display area NDA. For example, the rest of the display panel PNL except for the display area DA becomes the non-display area NDA of the display panel PNL. In an embodiment, the edge around the display area DA in the main area MA, an entirety of the bendable area BA, and an entirety of the sub-area SR may constitute the non-display area NDA. However, the disclosure is not limited thereto. The bendable area BA and/or the sub-area SR may include a portion of the display area DA.

The non-display area NDA may include a first non-display area NDA_1 and a second non-display area NDA_2. The first non-display area NDA_1 may surround the display area while contacting the display area DA. The second non-display area NDA_2 may be spaced apart from the display area DA while the first non-display area NDA_1 may be interposed (or disposed) between the display area DA and the first non-display area NDA_1. The second non-display area NDA_2 may surround the first non-display area NDA_1. A resin pattern UP (refer to FIG. 4) which will be described below may not be disposed in the first non-display area NDA_1, and the resin pattern UP may be disposed in the second non-display area NDA_2. The second non-display area NDA_2 may range from an edge of the display panel PNL to a position in an inside of the display panel PNL spaced from the edge by about 300 μm. The second non-display area NDA_2 may extend about 300 μm from and edge of the display panel PNL. The disclosure is not limited thereto.

Referring to FIG. 2 to FIG. 7, the display panel PNL may include a substrate SUB, a circuit layer CL, a light-emitting element layer LL, a thin-film encapsulation layer TFE, a touch electrode layer TSP, etc. which are stacked in this order.

The substrate SUB may provide a base of the display panel PNL and thus may support various layers included in the display panel PNL. The substrate SUB may be a flexible substrate SUB including a flexible polymer material such as polyimide. Accordingly, the display panel PNL may be flexible so as to be partially bent, folded, or rolled to fit various platforms (e.g., rollable, slidable, and foldable platforms) of the display device 1.

The circuit layer CL may supply a driving signal to the light-emitting element layer LL to be described below. The circuit layer CL may be disposed on the substrate SUB and may extend from the display area DA to the non-display area NDA. Although not shown in the drawing, the circuit layer CL may include a gate electrode, a source electrode, a drain electrode, a semiconductor pattern layer, etc. in the display area DA, and may include a signal line for applying a signal to the display area DA in the non-display area NDA.

The light-emitting element layer LL may receive the driving signal of the circuit layer CL and thus emit light. The light-emitting element layer LL may be disposed on the circuit layer CL and in the display area DA, and may not be disposed in the non-display area NDA. For example, the light-emitting element layer LL may overlap the display area DA of the main area MA of the display panel PNL in the third direction DR3. The light-emitting element layer may include pixels. The light-emitting element layer LL may include a micro light-emitting diode, an organic light-emitting layer, or a quantum dot light-emitting layer based on a type of the above-described display panel PNL.

The thin-film encapsulation layer TFE may prevent penetration of external moisture and oxygen into the light-emitting element layer LL. The thin-film encapsulation layer TFE may be disposed on the light-emitting element layer LL and may be disposed in the display area DA and the non-display area NDA. The thin-film encapsulation layer TFE may be disposed to surround the light-emitting layer LL in the third direction DR3 (hereinafter referred to as 'thickness') in the non-display area NDA as shown in FIG. 2 and FIG. 5.

The thin-film encapsulation layer TFE may include at least one organic layer and one or more inorganic layers. One organic layer and one or more inorganic layers may be stacked in an alternated manner with each other. For example, as shown in FIG. 6, the thin-film encapsulation layer TFE may include a first inorganic layer IO_1, a second inorganic layer IO_2, and an organic layer IO between the first inorganic layer IO_1 and the second inorganic layer IO_2. The disclosure is not limited thereto.

The touch electrode layer TSP may sense the user's hand motion. For example, the touch electrode layer TSP may sense the user's hand motion using self-capacitance or a mutual capacitance. The touch electrode layer TSP may be disposed on the thin-film encapsulation layer TFE, and may be disposed in the display area DA and the non-display area NDA.

The touch electrode layer TSP may include a touch protective layer TGL, at least one conductive layer and at least one insulating layer. One or more conductive and insulating layers may be stacked in an alternated manner with each other. For example, the touch electrode layer TSP may have a structure in which a buffer layer TBF, a first touch conductive layer TCL_1, a touch insulating layer TIL, and a second touch conductive layer TCL_2 are stacked in this order as shown in FIG. 3. The buffer layer TBF may be disposed on the second inorganic layer IO_2 of the thin-film encapsulation layer TFE, or may be omitted. Although not shown in the drawing, the first touch conductive layer TCL_1 and the second touch conductive layer TCL_2 may be arranged to intersect each other in a mesh shape when viewed in a plan view. The touch protective layer TGL may be disposed on the second touch conductive layer TCL_2. The touch protective layer TGL may be an organic layer. For example, the touch protective layer TGL may include at least one of acrylic-based resin, siloxane-based resin, and polyimide-based resin.

A planar shape of the touch electrode layer TSP may be the same as a planar shape of the thin-film encapsulation layer TFE. For example, the touch electrode layer TSP and the thin-film encapsulation layer TFE may entirely overlap each other in the third direction DR3. In an example, the touch electrode layer TSP may be omitted as shown in FIG. 5 depending on the platform of the display device 1.

A polarization member POL may be disposed on a top face of the display panel PNL. The polarization member POL polarizes incident light incident into the display area DA of the display panel PNL from an outside to improve display quality. The polarization member POL may be disposed on the touch electrode layer TSP or on the thin-film encapsulation layer TFE (when the touch electrode layer TSP is omitted). The polarization member POL may be disposed in the display area DA and the non-display area NDA and may have substantially the same planar shape as the planar shape of the main area MA of the display panel PNL. The disclosure is not limited thereto. For example, the polarization member POL may be disposed only in the display area DA and may be absent in the non-display area NDA. The polarization member POL may include a polarization adhesive layer POL_b bonded to the touch electrode layer TSP (or the thin-film encapsulation layer TFE) disposed under the polarization member POL, and a polarization layer POL_a to polarize the incident light.

A window cover WC may be disposed on the polarization member POL. The window cover WC may protect the elements inside the display panel PNL from the outside. The window cover WC may be made of glass, sapphire and/or plastic.

A window cover adhesive layer OCA may attach the window cover WC onto the polarization member POL. The window cover adhesive layer OCA may be disposed between the window cover WC and the polarization layer POL_a. The window cover adhesive layer OCA may be a transparent adhesive film including a UV-curable material that transmits visible light therethrough.

Referring to FIG. 2 and FIG. 4, when the touch electrode layer TSP is not omitted, the resin pattern UP may be disposed on a surface at a side in the third direction DR3 of the touch protective layer TGL in the second non-display area NDA_2. A dimension in the third direction DR3 (hereinafter, referred to as 'thickness') of the resin pattern UP may be much smaller than a dimension in the third direction DR3 (hereinafter, referred to as 'thickness') of each of the several layers constituting the display panel PNL. For example, the thickness of the resin pattern UP may be several nanometers (nm), whereas the thickness of each of several layers constituting the display panel PNL may be several hundreds of micrometers (μm). The resin pattern UP may be disposed in the second non-display area NDA_2 but may not disposed in the display area DA, and the thickness may be very small, and thus may not affect reliability of the display device 1. The resin pattern UP may be made of a UV-curable material, and may be the residue of a top protective film 1000 that is left on the display panel PNL after the top protective film 1000 has been removed in a manufacturing process of the display device 1 which will be described below. The material of the resin pattern may be different than that of the window cover adhesive layer OCA. For example, adhesion between the touch protective layer TGL and the resin pattern UP may be about 5 gf/inch$^2$, and adhesion between the window cover adhesive layer OCA and the polarization layer POL_a may be 20 times or greater of the adhesion between the touch protective layer TGL and the resin pattern UP.

Referring to FIG. 5 and FIG. 7, in case that the touch electrode layer TSP is omitted, the resin pattern UP may be disposed on a surface at one side in the third direction DR3 of the second inorganic layer IO_2 in the second non-display area NDA_2. Adhesion between the second inorganic layer IO_2 and the resin pattern UP may be about 5 gf/inch$^2$, and adhesion between the window cover adhesive layer OCA and the polarization layer POL_a may be about 20 times or greater of the adhesion between the second inorganic layer IO_2 and the resin pattern UP.

The resin pattern UP may be positioned randomly in the second non-display area NDA_2. For example, the resin pattern UP may be disposed in an entirety of the second non-display area NDA_2 or may not be disposed in the entirety of the second non-display area NDA_2, but may be disposed in a portion of the second non-display area NDA_2. A shape of the resin pattern UP may be linear as shown in FIG. 8. A width of the resin pattern may be larger as the resin pattern extends toward the edge of the display panel PNL. The resin pattern may have a wavy pattern composed of several curves. The disclosure is not limited thereto. Multiple resin patterns UP may be formed in the second non-display area NDA_2. For example, the resin patterns UP may be connected to each other, or the resin patterns UP may be disconnected from each other.

FIG. 9 to FIG. 12 are schematic plan views showing an area where the resin pattern is formed in a resin pattern area of the display device according to the embodiment of FIG. 1.

Figure 9:
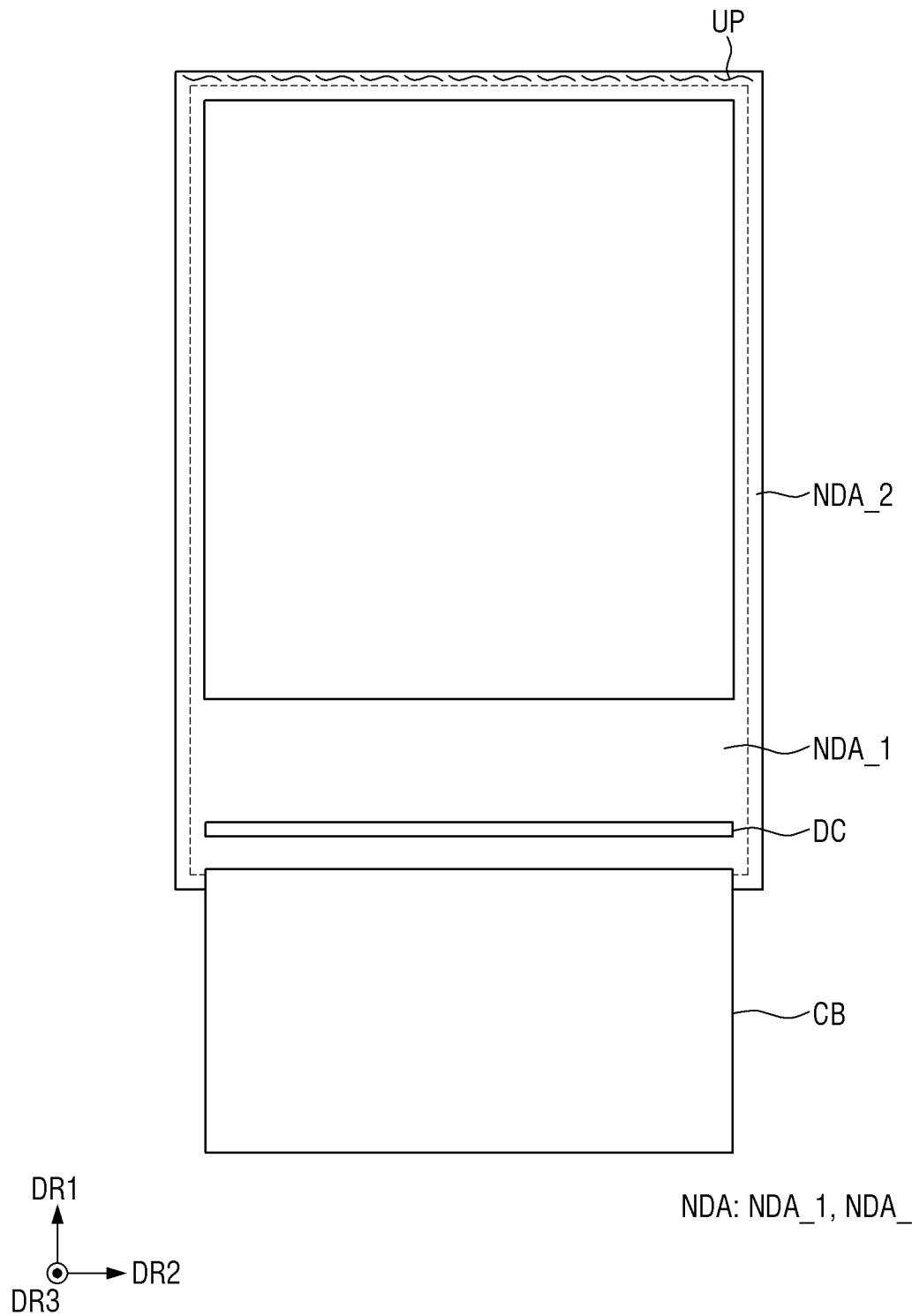
FIG. 9 to FIG. 12 are schematic plan views showing an area where a resin pattern is formed in a resin pattern area of the display device according to the embodiment of FIG. 1.

Referring to FIG. 9, it is illustrated that the resin pattern UP may be formed horizontally in a portion of the second non-display area NDA_2 located in a side end in the first direction DR1 of the display device 1.

Figure 10:
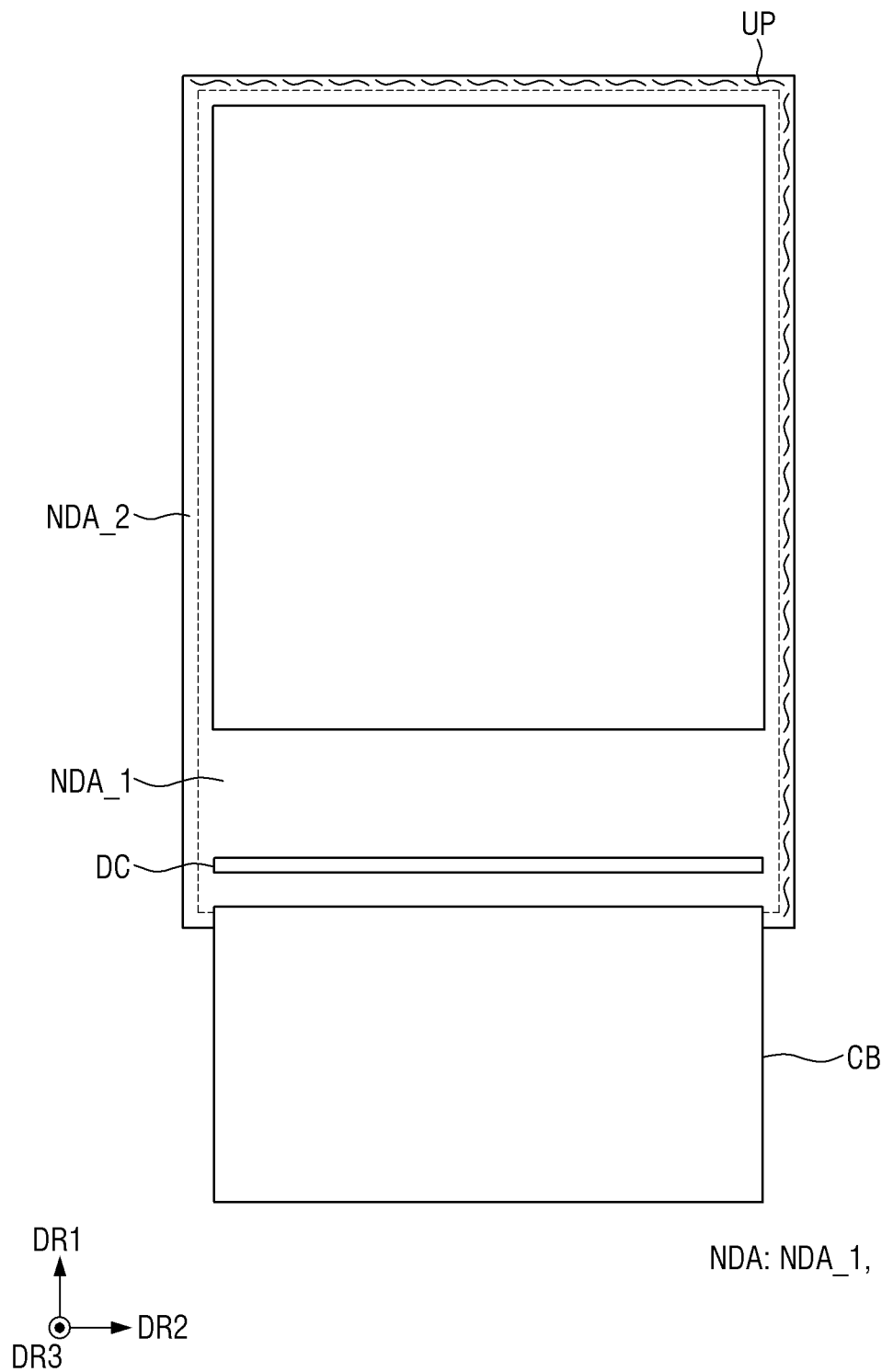

Referring to FIG. 10, it is illustrated that the resin pattern UP may be formed in portions of the second non-display area NDA_2 horizontally in a side end in the first direction DR1 of the display device 1, and vertically in a side end in the second direction DR2.

Figure 11:
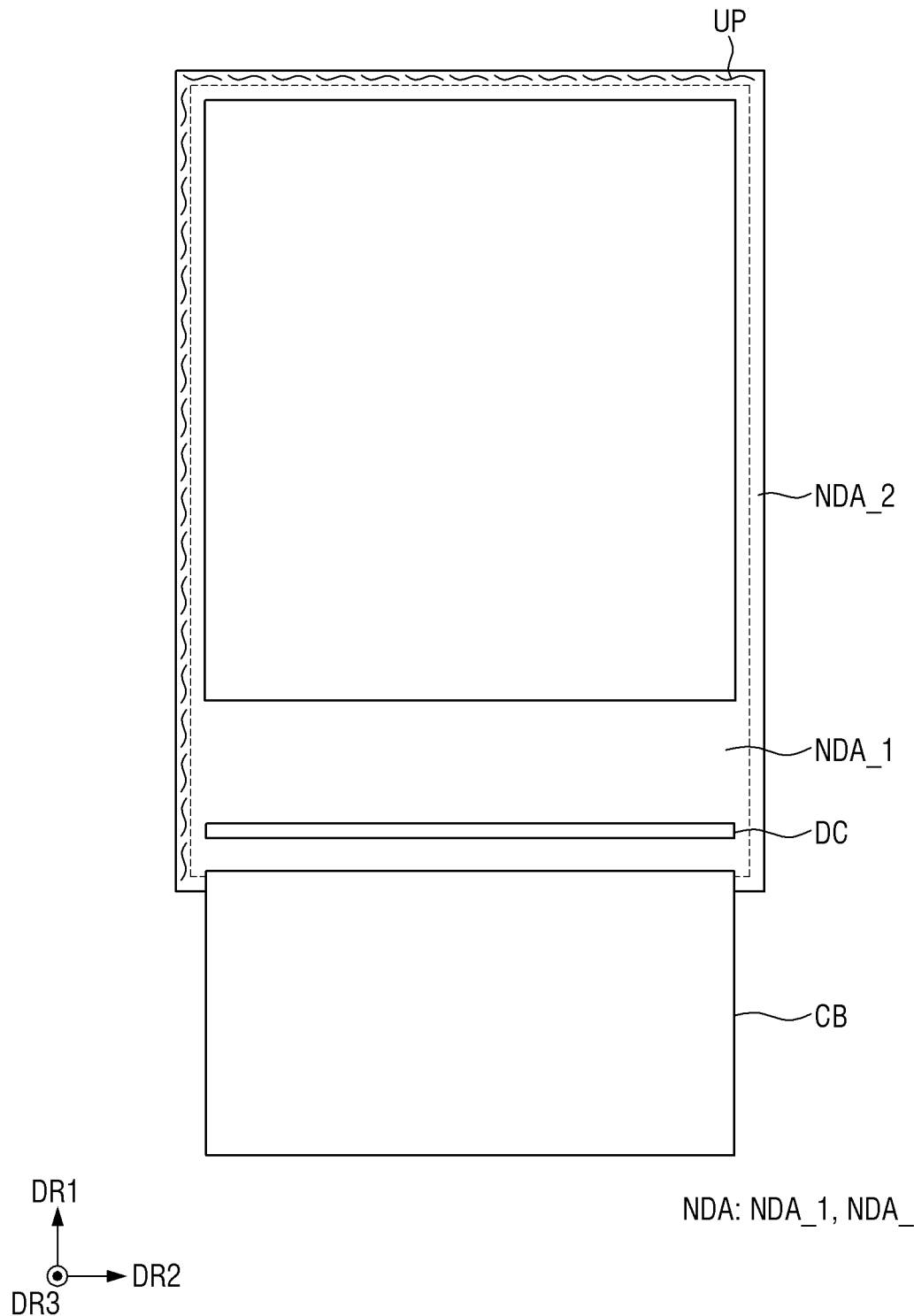

Referring to FIG. 11, it is illustrated that the resin pattern UP may be formed in portions of the second non-display area NDA_2 horizontally at a side end in the first direction DR1 of the display device 1 and vertically at the opposite side in the second direction DR2 compared to FIG. 10.

Figure 12:
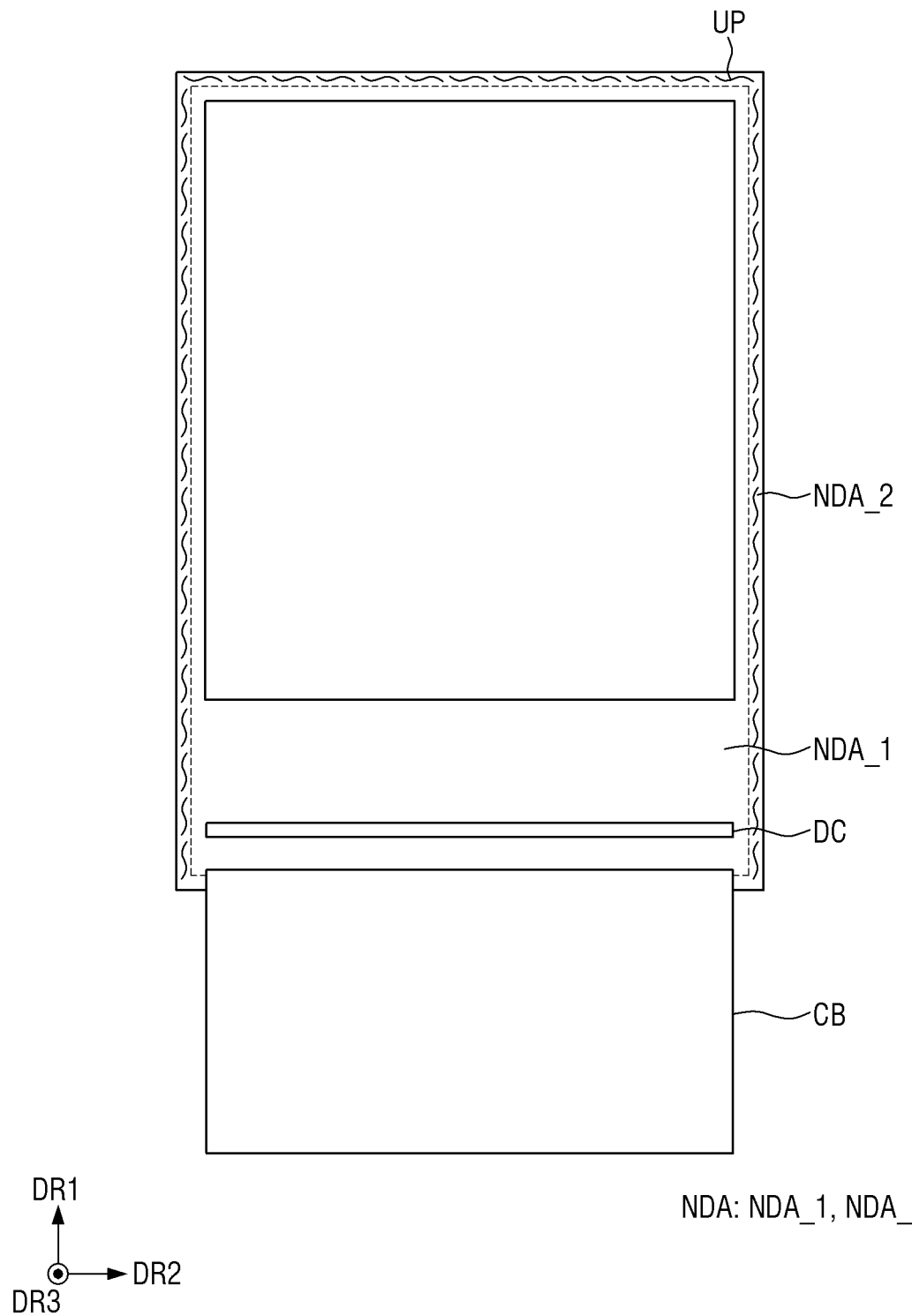

Referring to FIG. 12, it is illustrated that the resin pattern UP may be formed in the entirety of the second non-display area NDA_2.

The display device 1 according to the embodiment of FIG. 1 as described above may reduce the material cost for forming the top protective film 1000 required for manufacturing display device 1 which will be described below. Hereinafter, a method 2 for manufacturing the display device 1 according to the embodiment of FIG. 1 will be described in detail.

In the method 2 (not in the drawings) for manufacturing the display device, a process of forming a mother display panel MPNL on a mother substrate MG, a process of forming a panel complex PC (refer to FIG. 19) on the mother substrate MG, a process of separating the panel complex PC and the mother substrate MG from each other, a process of scribing the mother display panel MPNL to obtain the display panel PNL, and a process of separating the top protective film 1000 (refer to FIG. 19) disposed on the obtained display panel PNL may be sequentially performed. For convenience of description, the process of forming the mother display panel MPNL on the mother substrate MG is first described.

Figure 13:
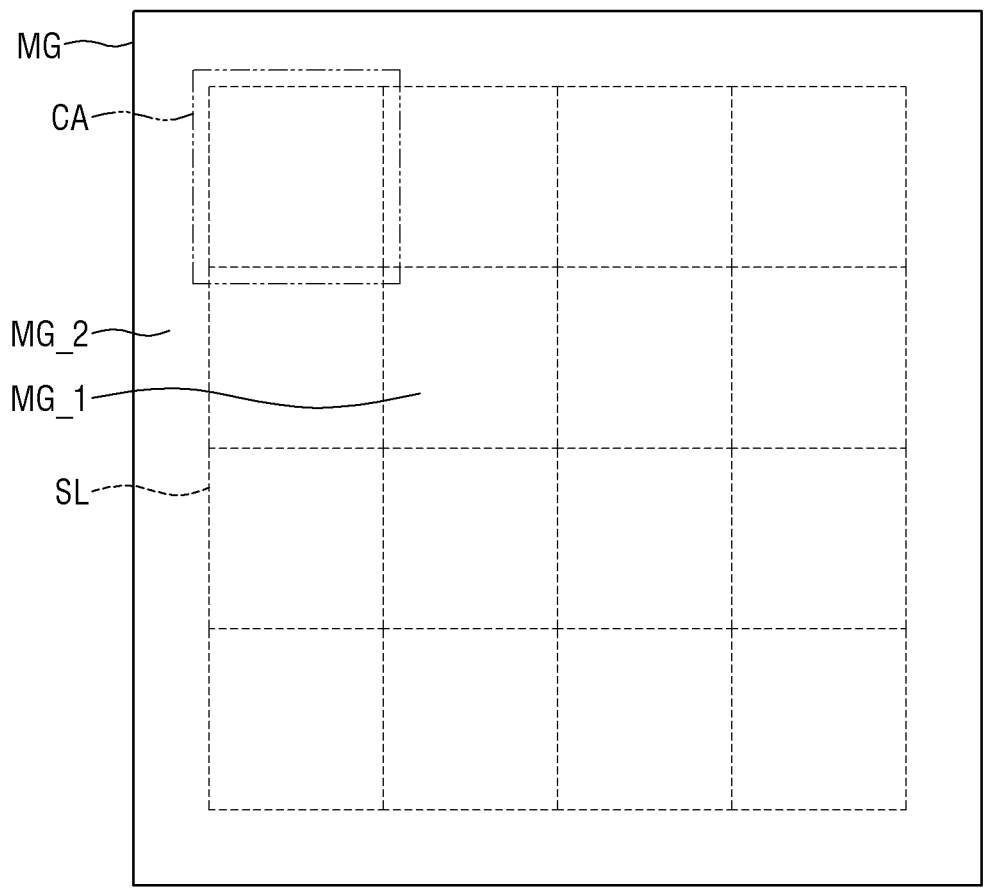
FIG. 13 is a schematic plan view showing a mother substrate for manufacturing the display device according to the embodiment of FIG. 1.
Figure 14:
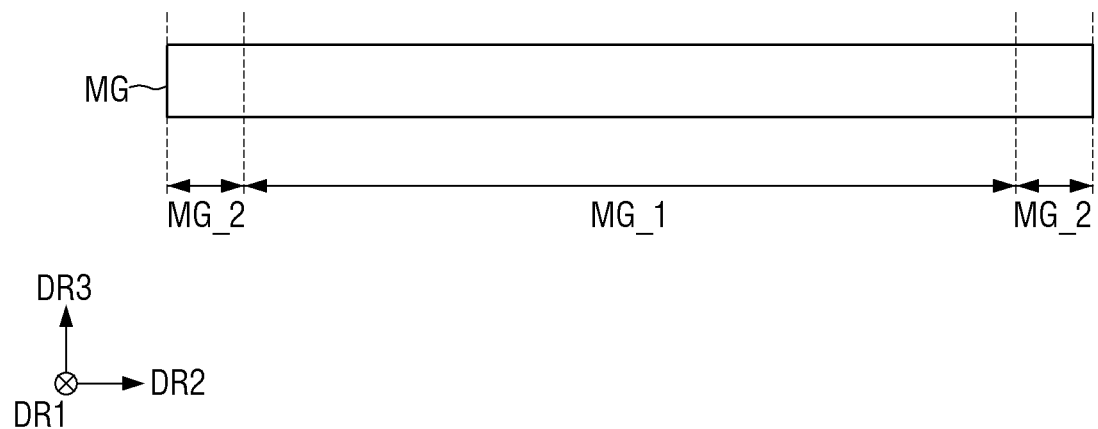
FIG. 14 is a schematic cross-sectional view of the mother substrate as viewed in a first direction.
Figure 15:
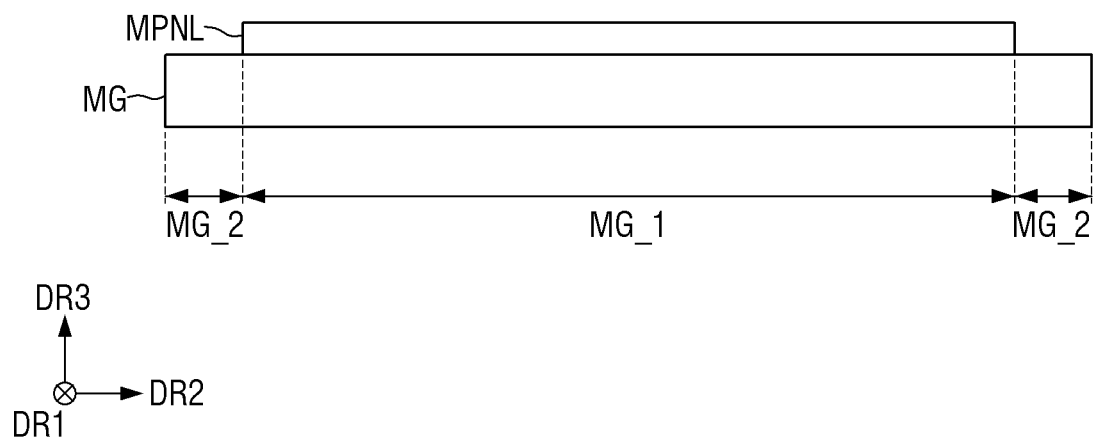
FIG. 15 is a schematic diagram showing a process of placing a mother display panel on the mother substrate.
Figure 16:
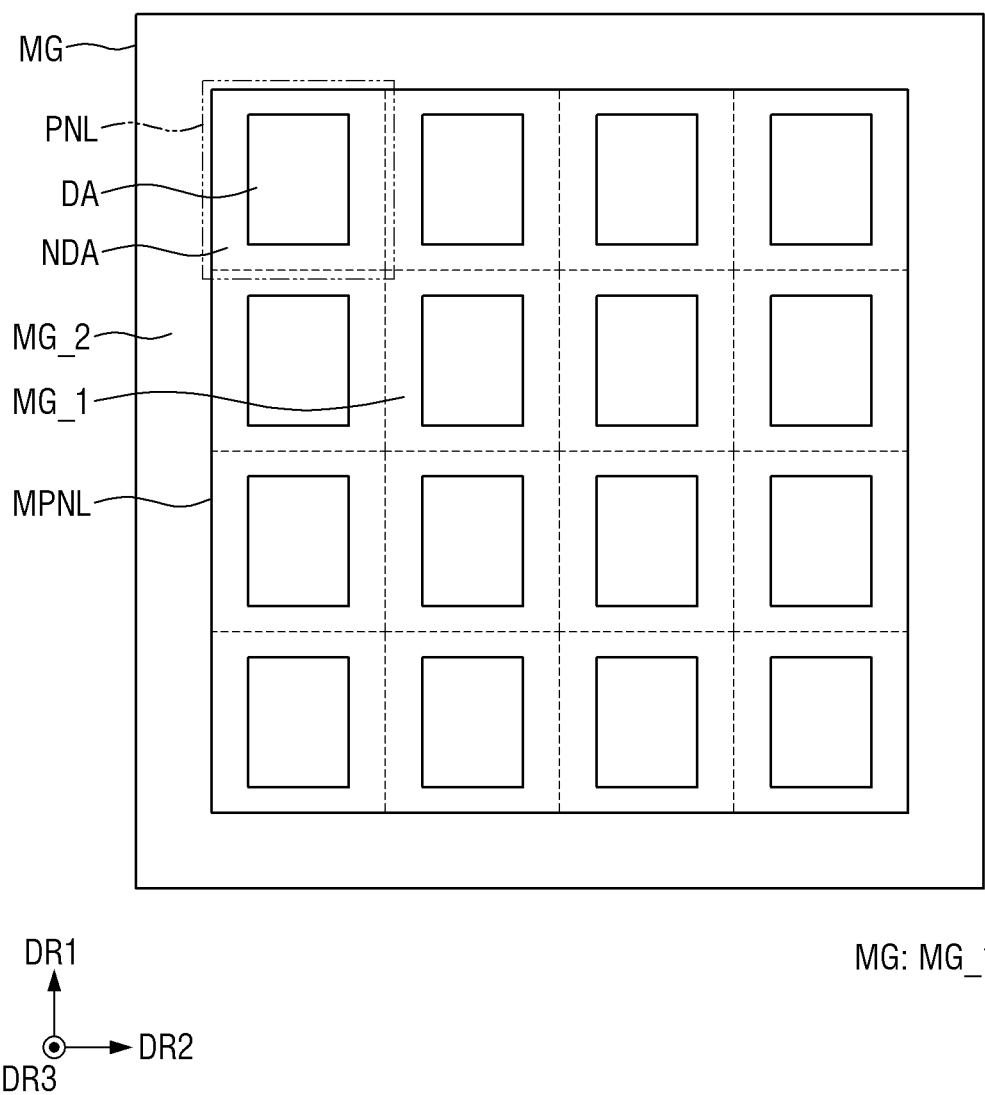
FIG. 16 is a schematic plan view showing a display panel formed by placing the mother display panel on the mother substrate.

FIG. 13 is a schematic plan view showing the mother substrate used for manufacturing the display device according to the embodiment of FIG. 1. FIG. 14 is a schematic cross-sectional view of the mother substrate as viewed in the first direction. FIG. 15 is a schematic diagram showing a process of placing the mother display panel on the mother substrate. FIG. 16 is a schematic plan view showing the display panel formed by placing the mother display panel on the mother substrate.

Referring to FIG. 13, multiple display devices 1 according to FIG. 1 may be simultaneously manufactured by performing a process on a mother substrate MG (on a mother substrate basis) including cell areas CA.

The mother substrate MG may have a rectangular shape as shown in FIG. 13. The disclosure is not limited thereto. For example, the mother substrate MG may have a circular shape. Hereinafter, for convenience of description, the mother substrate MG will be illustrated as having a rectangular shape.

A face of a side in the third direction DR3 of the mother substrate MG may be defined as a top face on which the display panel PNL (which will be described below) is disposed, and the opposite face in the third direction DR3 may be defined as a bottom face of the mother substrate MG on which the display panel PNL is not disposed.

The mother substrate MG may include a first area MG_1 in which cell areas CA are formed, and a second area MG_2 surrounding the first area MG_1 in which the cell areas CA are not formed.

The cell areas CA of the mother substrate MG may be arranged in a matrix structure. A scribing line SL may be defined between adjacent cell areas CA as shown by a dashed line in FIG. 13.

The mother substrate MG may be made of glass. The disclosure is not limited thereto.

Referring to FIG. 14 and FIG. 15, the mother substrate MG may be provided, and the mother display panel MPNL may be formed on the mother substrate MG. A polyimide layer may be stacked on the mother substrate MG to form the substrate (SUB in FIG. 2). The circuit layer CL, the light-emitting element layer LL, the thin-film encapsulation layer TFE, and the touch electrode layer TSP as described with reference to FIG. 2 may be formed on the substrate SUB. The mother display panel MPNL may be formed by various processes which are not described here in detail.

The opposite face in the third direction DR3 of the mother display panel MPNL, which may be defined as a bottom face of the mother display panel MPNL, may contact the top face of the mother substrate MG. The face of the mother display panel MPNL at a side in the third direction DR3 may be defined as a top face that does not contact the mother substrate MG. The mother display panel MPNL may have a side face connecting the top face and the bottom face to the third direction DR3 to each other.

Referring to FIG. 16, the mother display panel MPNL may be formed on the top face of the mother substrate MG. Thus, the display panel PNL may be defined in an area where the mother display panel MPNL and the cell area CA overlap each other. The display area DA and the non-display area NDA may be defined in each display panel PNL.

After the process of forming the display panel PNL on the top face of the mother substrate MG as described above, the process of forming the panel complex PC on the top face of the display panel PNL is performed.

Figure 17:
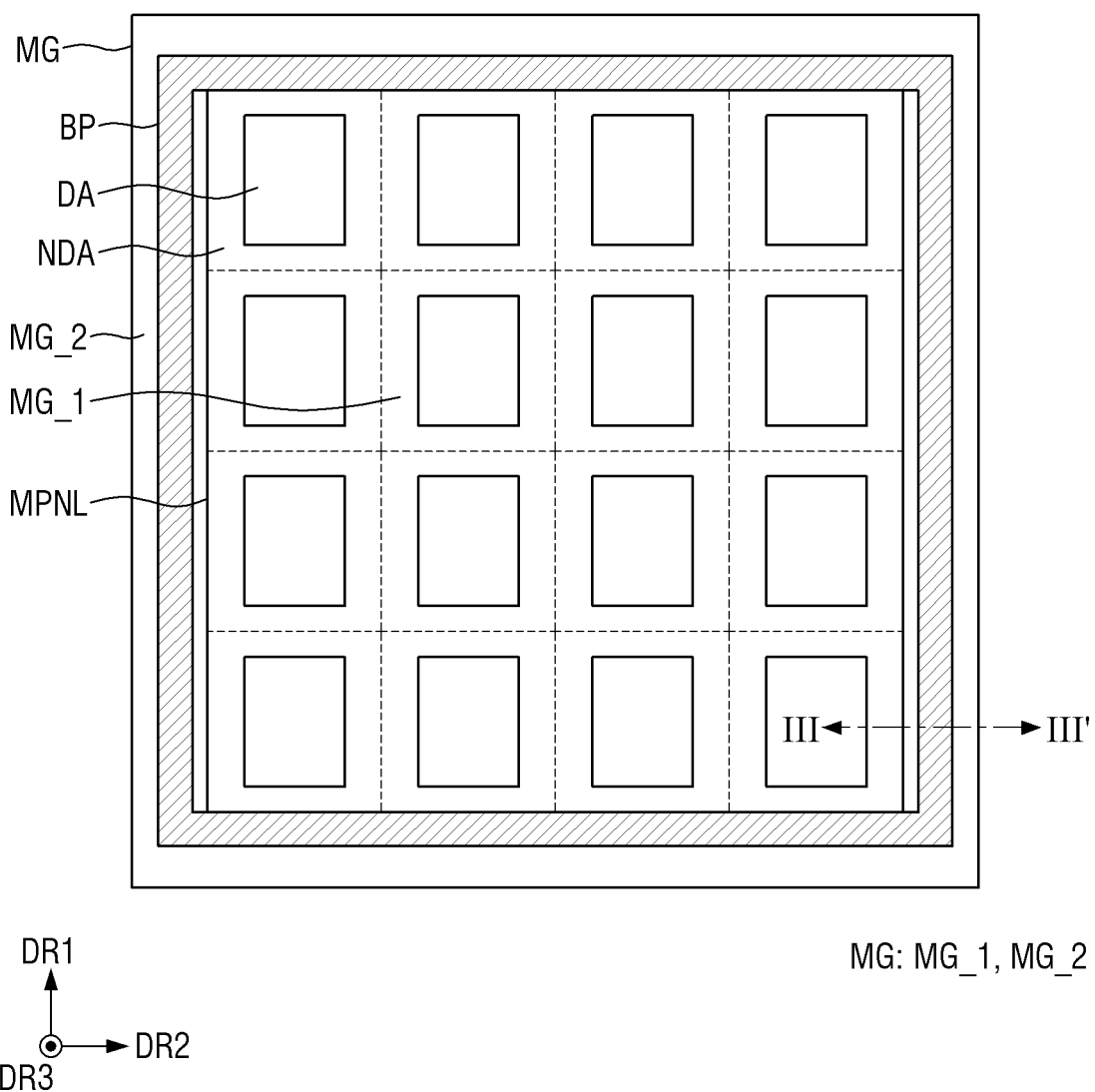
FIG. 17 is a schematic diagram showing a process of forming a bump on a top face of the mother substrate.
Figure 18:
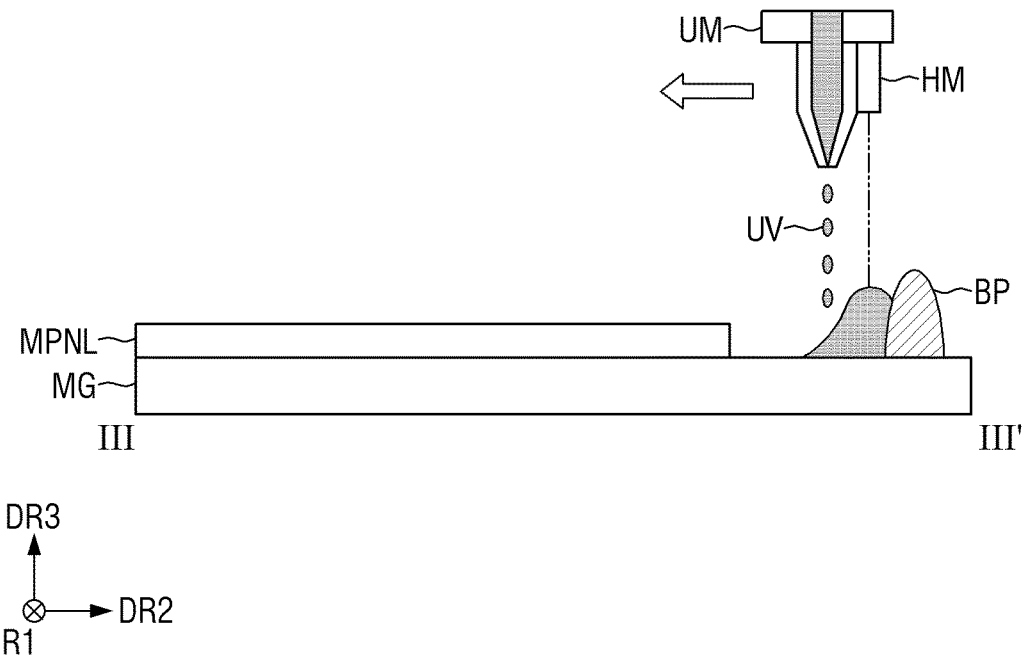
FIG. 18 and FIG. 19 are schematic diagrams showing a process of applying an UV-curable resin on the mother display panel using an ink-jet scheme to form an top protective film, based on a cross-sectional view of the mother substrate and the mother display panel of FIG. 17 taken along a line III-III'.
Figure 19:
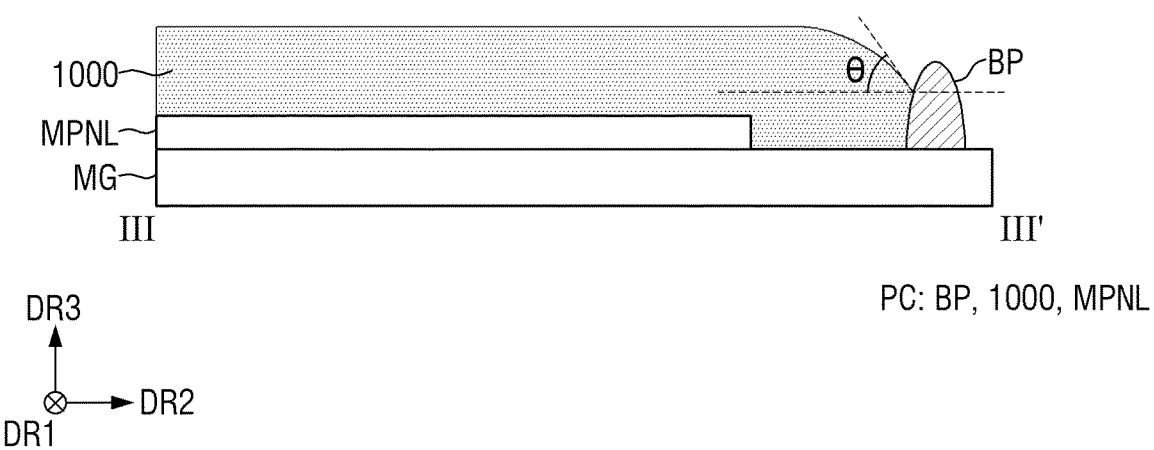
Figure 20:
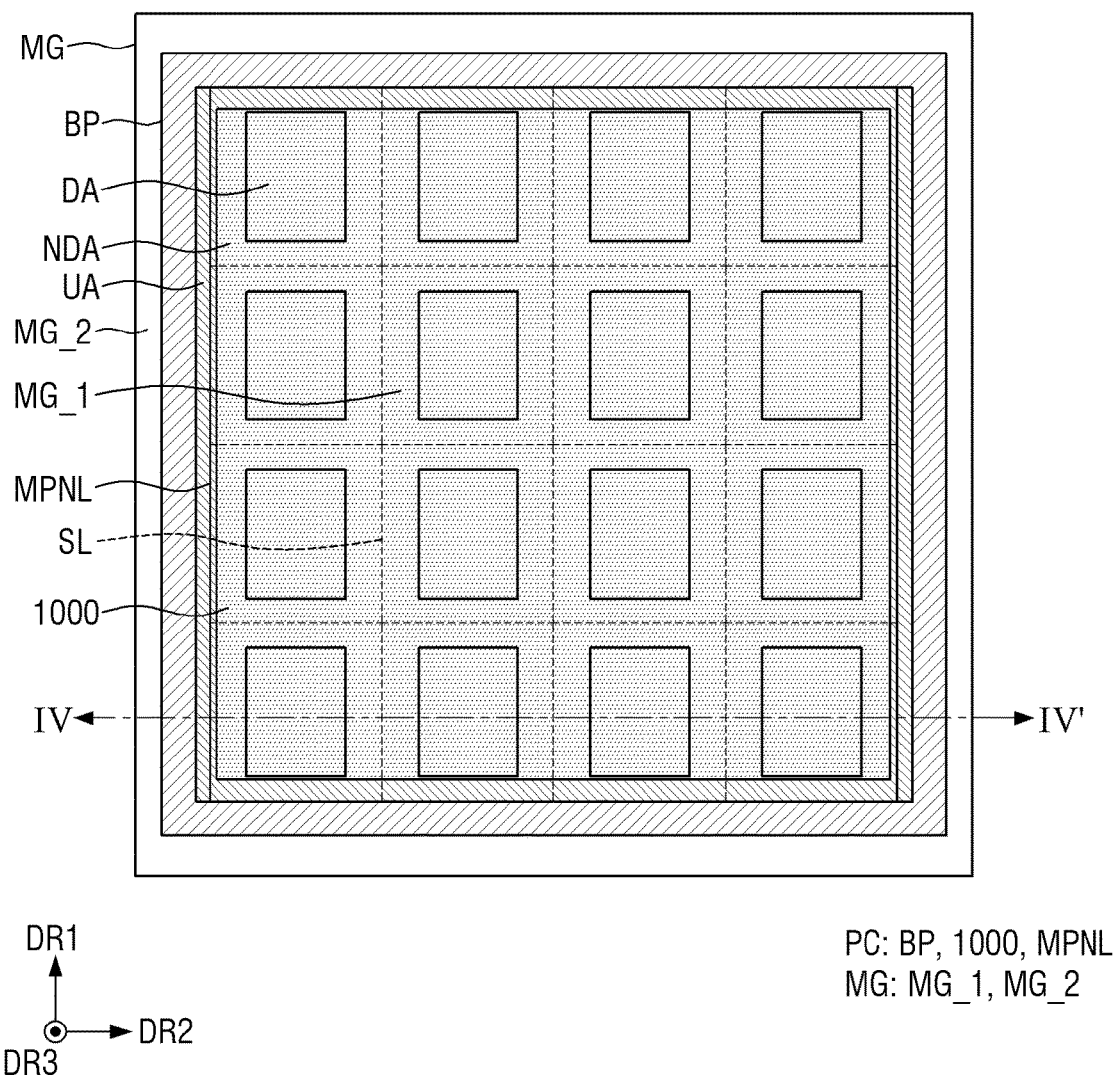
FIG. 20 is a schematic plan view showing a state in which a panel complex is formed on a top face of the mother substrate.
Figure 21:
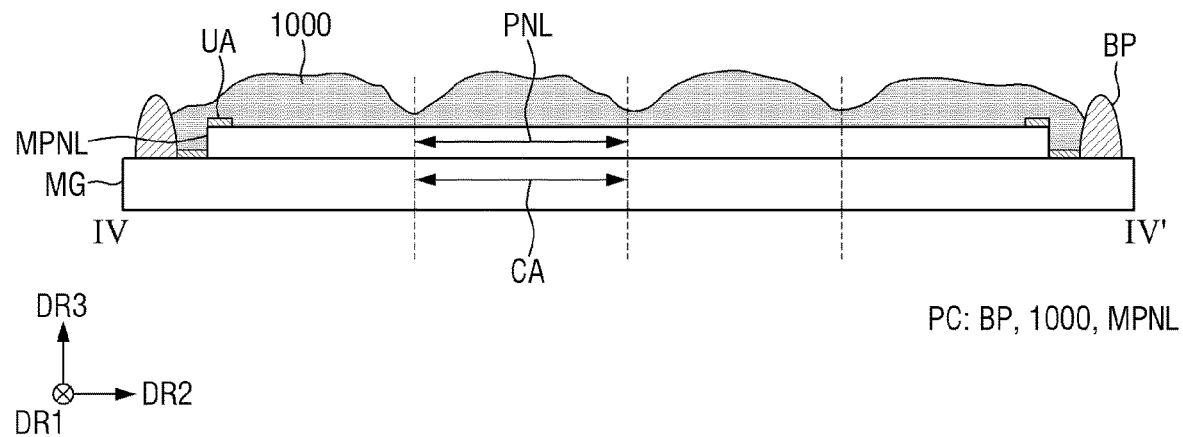
FIG. 21 is a schematic cross-sectional view of the mother substrate and the panel complex of FIG. 20 as cut along a line IV-IV.

FIG. 17 is a schematic diagram showing a process of forming bump on the top face of the mother substrate. FIG. 18 and FIG. 19 are schematic diagrams schematically showing a process of applying an UV-curable resin on the mother display panel using an ink-jet scheme to form an top protective film, based on a schematic cross-sectional view of the mother substrate and the mother display panel of FIG. 17 taken along a line III-III'. FIG. 20 is a plan view showing a state in which a panel complex is formed on a top face of the mother substrate. FIG. 21 is a schematic cross-sectional view of the mother substrate and the panel complex of FIG. 20 as cut along a line IV-IV. FIG. 20 also provides a schematic plan view showing a pattern area UA formed on an edge of the top protective film.

Referring to FIG. 17, in the process of forming the bump BP, the bump BP is formed on a top face of the mother substrate in the second area MG_2 after the mother display panel MPNL has been placed on the first area MG_1 of the mother substrate MG. The bump BP serves as a spreading control layer that prevents the UV-curable resin which will be described below from spreading out of the mother substrate MG when the UV-curable resin is applied, and serves to facilitate separation between the mother substrate MG and the mother display panel MPNL during the separating process to be described below.

The bump BP may be disposed at both opposing sides in the first direction DR1 and both opposing sides in the second direction DR2 of the mother display panel MPNL. The bump BP may be spaced apart from the side edges of the mother display panel MPNL in the second direction DR2 by a selected spacing and may be adjacent to the side edges of the mother display panel MPNL in the first direction DR1. The bump BP may be spaced apart from the side edges of the mother display panel MPNL in the second direction DR2 by a spacing in a range of about 700 μm to about 1300 μm, and may contact the side edges of the mother display panel MPNL in the first direction DR1. In other examples, the bump BP may be spaced apart from side edges in the first direction DR1 by a spacing of about 100 μm. The disclosure is not limited thereto. Accordingly, a portion of the top face of the mother substrate MG in the second area MG_2 between each of both opposing side ends in the second direction DR2 of the mother display panel MPNL and the bump BP may be exposed. Further, a portion of the top face of the mother substrate MG in the second area MG_2 between each of both opposing side ends in the first direction DR2 of the mother display panel MPNL and the bump BP may be exposed or not be exposed depending on a position of the bump BP. In an example, a releasing knife K which will be described below may be inserted into both opposing sides in the second direction DR2 of the mother display panel MPNL. A detailed description thereof will be provided below.

As shown in FIG. 17, the bump BP may have a bar shape with a uniform width and may extend on a plane parallel to the mother panel and may be integrally formed into a single rectangular body and may surround the entirety of the mother display panel MPNL. The disclosure is not limited thereto. For example, the bump BP may be disposed outside the mother display panel MPNL and may not be integrally formed into a single rectangular body, but may be partially formed into a portion of the single rectangular body to surround only a portion of the mother display panel MPNL. A width of the bump BP may be about 200 μm or greater. The disclosure is not limited thereto.

The bump BP may be made of a UV-curable material, and may include at least one of acrylate-based polymer groups (for example, polyester acrylate-based resin or polyurethane acrylate-based resin). The disclosure is not limited thereto. For example, the bump BP may be made of a UV-curable material other than the acrylate-based polymer or a heat curable material rather than the UV-curable material. When the bump BP is made of the UV-curable material, the bump BP may be formed by applying the UV-curable material using an ink-jet scheme, and then irradiating ultraviolet rays to the applied UV-curable material.

Referring to FIG. 18 and FIG. 19, after the process of forming the bump BP on the top face of the mother substrate MG in the second area MG_2, a UV-curable resin UV is applied to the exposed portion of the top face of the mother substrate MG in the second area MG_2 and the top face of the mother display panel MPNL in an ink-jet manner and using a UV-curable resin ejector UM. Thus, the top protective film 1000 is formed.

As shown in FIGS. 18 and 19, the bump BP may have a semi-circular cross-section or a semi-elliptical cross-section having a long side extending in the third direction DR3 and a short side extending in the second direction DR2. The disclosure is not limited thereto. For example, a width of a portion of the bump BP that may contact the top face of the mother substrate MG, for example, a width in the second direction DR2 of the bump may be about 200 μm or greater as described above, and a dimension in the third direction DR3 (hereinafter, referred to as 'thickness') of the bump BP may be about 100 μm or greater. The disclosure is not limited thereto.

The UV-curable resin UV may be a material that is curable via UV application. The UV-curable material may include at least one of the acrylate-based polymer groups, (for example, polyester acrylate-based resin or polyurethane acrylate-based resin). The disclosure is not limited thereto. The UV-curable resin UV and the bump BP may be made of the same material, or may be made of different materials.

The UV-curable resin ejector UD may serve to apply the UV-curable resin UV to the top face of the mother display panel MPNL using an ink-jet. The UV-curable resin ejector UD may apply the UV-curable resin UV onto the touch protective layer TGL of the touch electrode layer TSP disposed on the topmost of the mother display panel MPNL (or onto the second inorganic layer IO_2 of the thin-film encapsulation layer TFE when the touch protective layer TGL is omitted). The UV-curable resin ejector UD may also apply the UV-curable resin UV to the exposed portion of the top face of the mother substrate MG in the second area MG_2 between the bump BP and the mother display panel MPNL. The UV-curable resin ejector UD may eject microdroplets of the UV-curable resin UV as shown in FIG. 18, and deposit the microdroplets on the top face of the mother substrate MG and the mother display panel MPNL such that the microdroplets are spaced from each other by a constant spacing. The UV-curable resin UV may be applied in the ink-jet manner and using the UV-curable resin ejector UD, such that the UV-curable resin UV may be selectively applied to the top face of the mother display panel MPNL when necessary. Decreasing a spacing between impact-points of the droplets of the UV-curable resin UV may form a thick UV-curable resin UV in the third direction DR3. In other examples, increasing the spacing between the impact-points of the droplets of the UV-curable resin UV may form a thin UV-curable resin UV in the third direction DR3.

The UV-curable resin ejector UD may apply the UV-curable resin UV on the top face of the mother substrate MG and the top face of the mother display panel MPNL and in a direction from a vicinity of the bump BP to the mother display panel MPNL (i.e., the opposite side in the second direction DR2). The UV-curable resin ejector UD may apply the UV-curable resin UV to a region inwardly of the bump BP, for example, inward with respect to the inner side face of the bump BP facing toward the display panel. The UV-curable resin ejector UD may not apply the UV-curable resin UV to a region outwardly of the bump BP, for example, a region beyond the outer side face of the bump BP.

A side face of the UV-curable resin UV may be applied at a selected inclination angle θ due to the bump BP as shown in FIG. 19. A side face of a portion of the UV-curable resin UV applied to a region adjacent to the inner side face of the bump BP may have an inclination angle θ in a range of about 5° to about 50° with respect to a plane parallel to the mother substrate MG. As the side face of the portion of the UV-curable resin UV applied to the region adjacent to the inner side face of the bump BP has the predefined inclination angle θ, the separating process of the mother substrate MG to be described below may be facilitated. A detailed description thereof will be provided below.

Referring to FIG. 20 and FIG. 21, the UV-curable resin UV may be applied to an entirety of the mother display panel MPNL, and may not overflow the bump BP and thus may not be applied on a portion of the mother substrate MG outwardly of the bump BP. Further, the UV-curable resin UV may be partially applied to a top face of the display area DA as needed, so that a dimension in the third direction DR3 (hereinafter referred to as 'thickness') of the applied UV-curable resin UV may not be uniform. For example, the UV-curable resin UV may have a smaller thickness on an area along which a scribing line SL of the mother display panel MPNL extends, and may have a larger thickness on an area along which the scribing line SL does not extend.

In an example, a curing device HM for curing the UV-curable resin UV may be disposed on a side face of the UV-curable resin ejector UM. The curing device HM may irradiate UV rays to the UV-curable resin UV applied on the top face of the mother substrate MG or the mother display panel MPNL by the UV-curable resin ejector UM, thereby curing the UV-curable resin UV. The curing device HM may move together with the UV-curable resin ejector UM. Therefore, the UV-curable resin UV applied onto the top faces of the mother substrate MG and the mother display panel MPNL by the UV-curable resin ejector UM may be cured immediately by the curing device HM immediately following the ejector.

The UV-curable resin UV may be applied on the top face of the mother substrate MG and the mother display panel MPNL, and may be cured by the curing device HM, such that the top protective film 1000 may be formed on the top face of the mother substrate MG and the mother display panel MPNL.

The top protective film 1000 may prevent defects such as scratches that may occur on the top face of the mother display panel MPNL while the mother display panel MPNL is transferred from processing on the mother substrate basis to the processing on a module basis.

The top protective film 1000 may be disposed to cover both the top and side faces of the mother display panel MPNL. The top protective film 1000 may be disposed to cover the exposed portion of the top face of the mother substrate MG depending on the position of the bump BP. A side face of a portion of the top protective film 1000 in the vicinity of the bump BP may have an inclination angle of about 5° to about 50° with respect to the top face of the mother substrate MG.

A face at a side in the third direction DR3 of the top protective film 1000 may be defined as a top face that does not contact the top face of the mother substrate MG and the top face the top face of the mother display panel MPNL. A face on the opposite side in the third direction DR3 may be defined as a bottom face of the top protective film 1000 that contacts the top face of the mother substrate MG and the top face of the mother display panel MPNL.

As shown in FIG. 21, the top protective film 1000 may be thin in an area where the mother display panel MPNL overlaps with the scribing line SL since it is less necessary to prevent scratches in this area. In contrast, the top protective film 1000 may be thick in an area where the mother display panel MPNL does not overlap the scribing line SL since it is necessary to prevent scratches in this area. The disclosure is not limited thereto. A thickness of the top protective film 1000 may be in a range of about 100 μm to about 200 μm.

The top protective film 1000 may be formed by curing the UV-curable resin UV, and thus may be made of the same constituent material as that of the UV-curable resin UV. For example, the top protective film 1000 may include at least one of the acrylate-based polymer groups.

In an example, a pattern area UA may be formed at an edge of a bottom face of the top protective film 1000 as shown in FIG. 21. The resin pattern UP may be formed in one area of the top face of the mother display panel MPNL overlapping the pattern area UA in the third direction DR3.

The pattern area UA of the top protective film 1000 may overlap with a portion of the top face of each of the mother substrate MG and the mother display panel PNL. The pattern area UA of the top protective film 1000 may occupy at least a region of the bottom face of the top protective film 1000 from an edge of the top protective film 1000 to a position spaced apart from and inwardly of the edge of the top protective film 1000, for example, a position displaced from the edge of the top protective film 1000 in the second direction DR2 by about 200 µm or about 300 µm. The disclosure is not limited thereto.

The panel complex PC includes the bump BP, the top protective film 1000, and the mother display panel MPNL. The panel complex PC is disposed on the top face of the mother substrate MG. The process for obtaining the mother display panel MPNL to be described later proceeds in a state in which the mother substrate MG is removed therefrom. Thus, in order to perform the process of obtaining the mother display panel MPNL, it is necessary to separate the panel complex PC and the mother substrate MG from each other. Hereinafter, the process of separating the panel complex PC and the mother substrate MG from each other will be described in detail.

Figure 22:
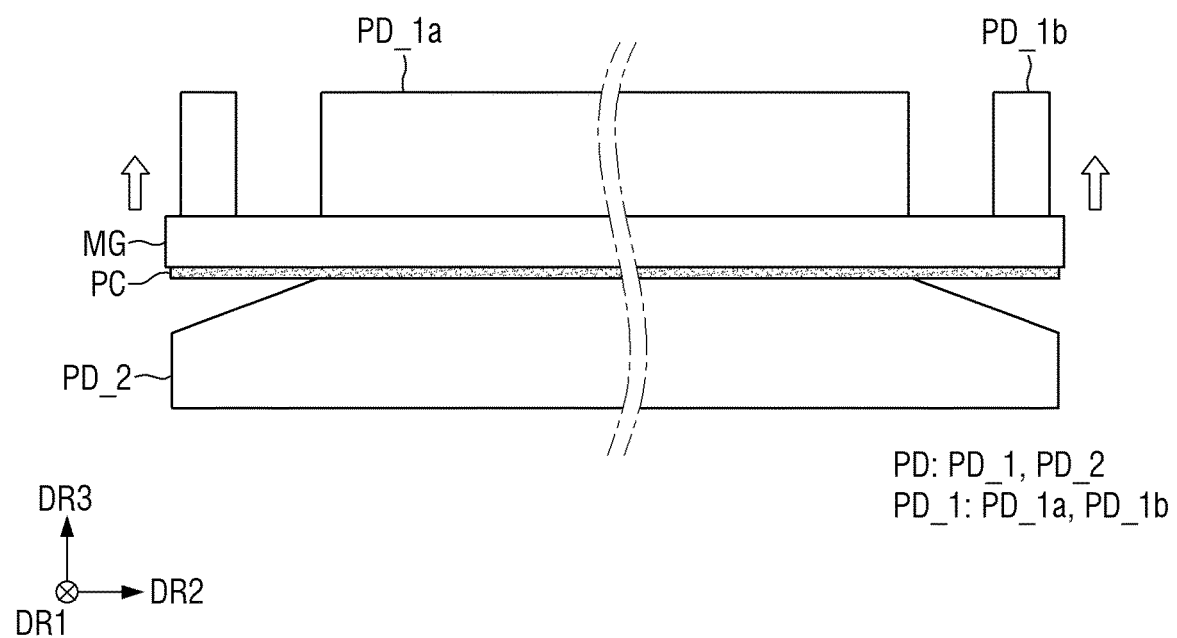
FIG. 22 is a schematic diagram showing the structure of a separating device that separates the panel complex and the mother substrate from each other.
Figure 23:
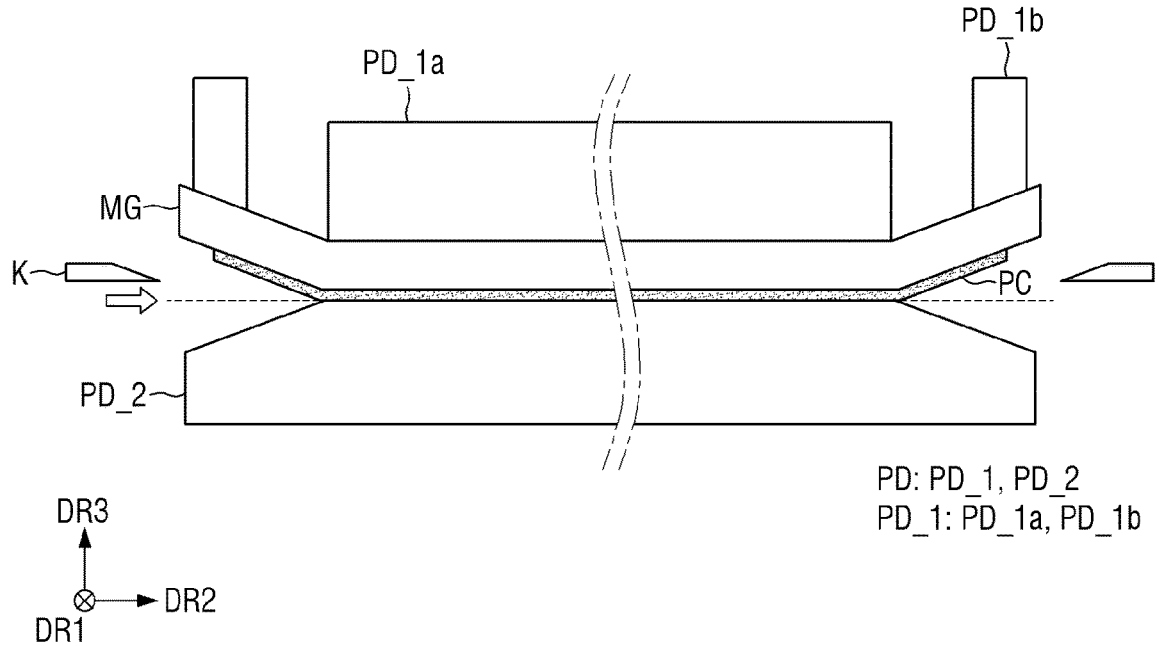
FIG. 23 is a schematic cross-sectional view showing the mother substrate and the panel complex bent toward a side in a third direction by the separating device.
Figure 24:
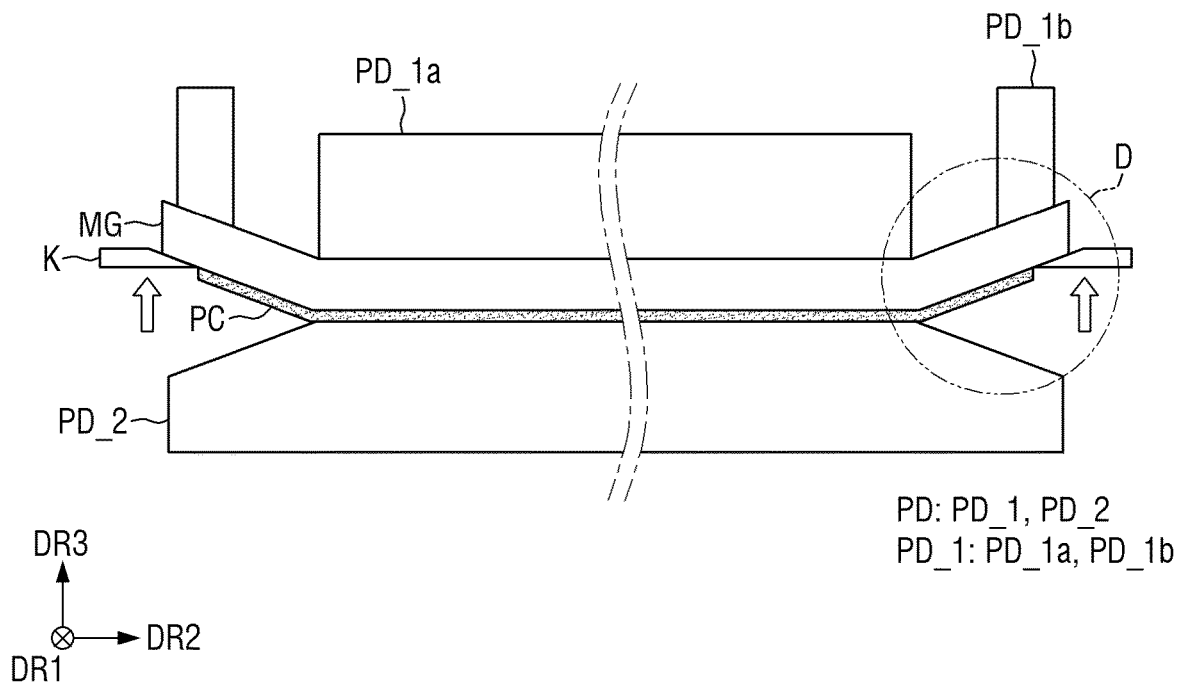
FIG. 24 is a schematic cross-sectional view showing a releasing knife disposed between the mother substrate and the panel complex.
Figure 25:
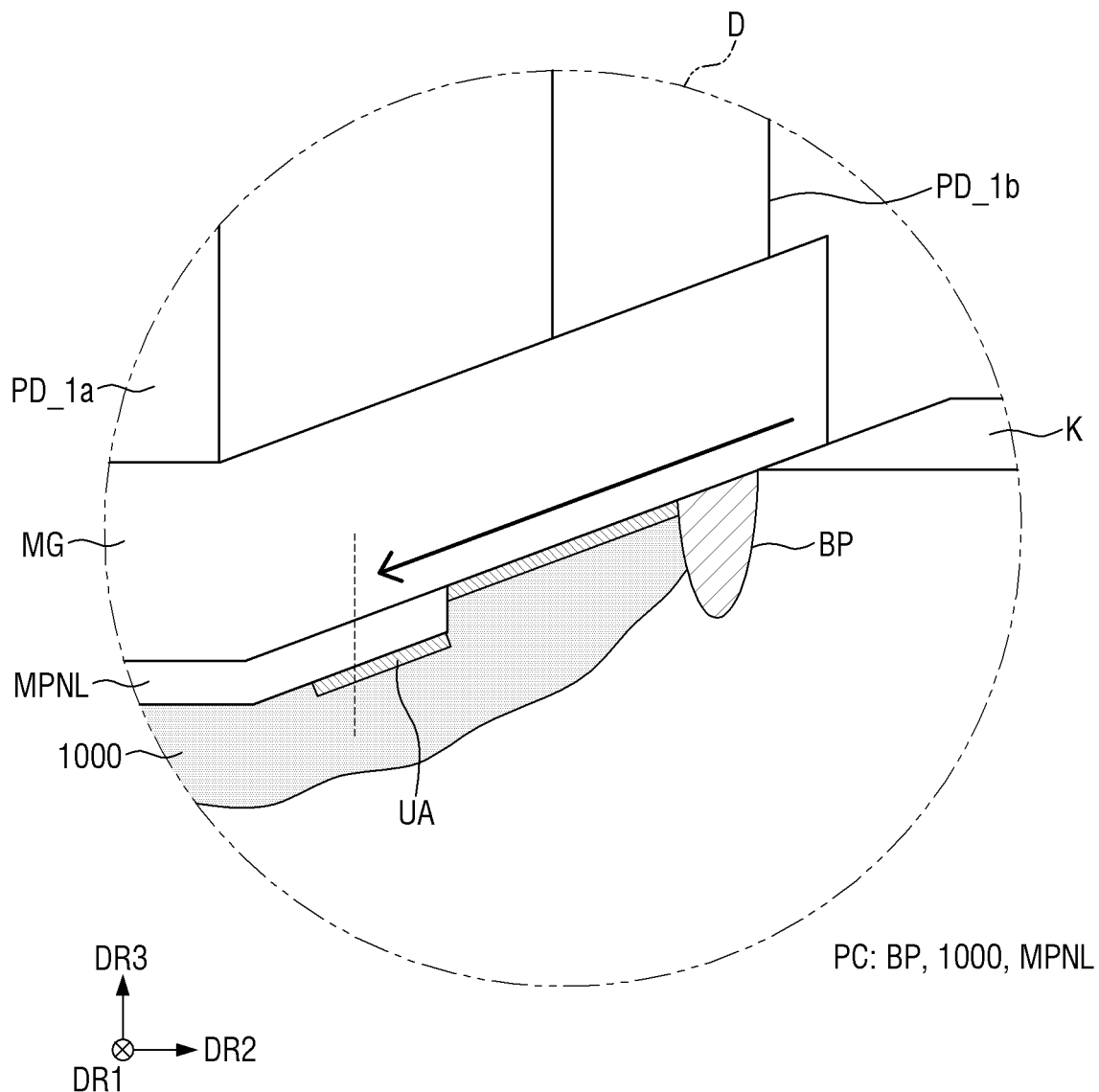
FIG. 25 is an enlarged schematic view of an area D of FIG. 24.
Figure 26:
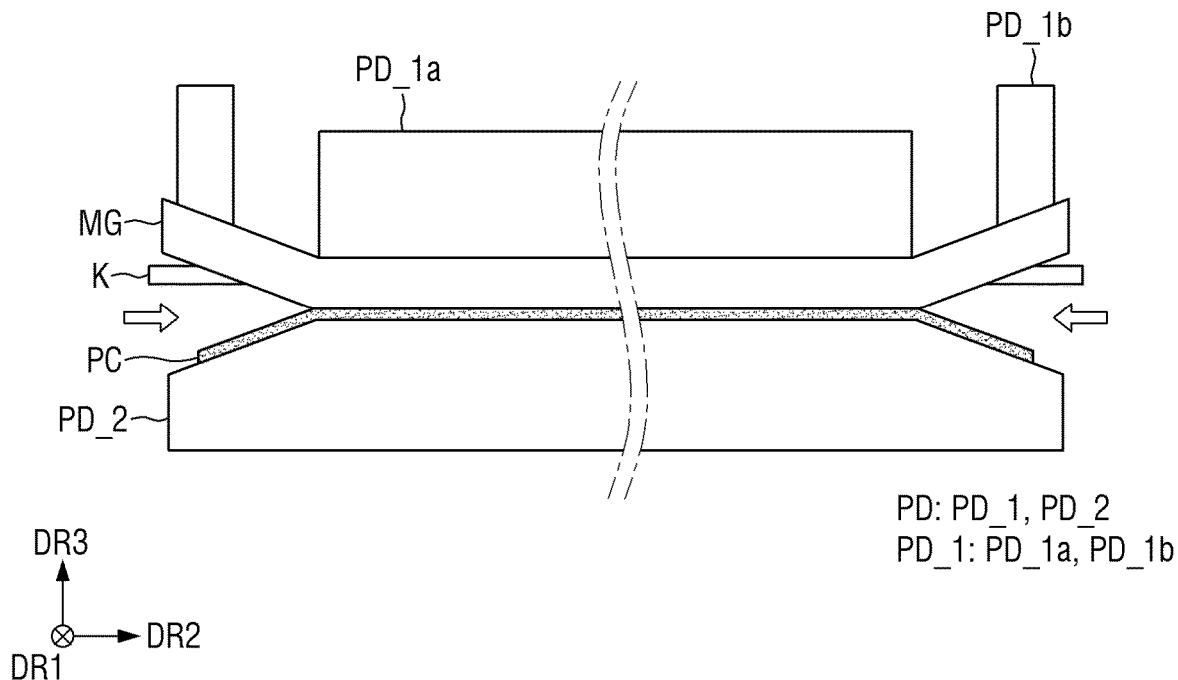
FIG. 26 is a schematic diagram showing a process in which the releasing knife separates the mother substrate and the panel complex from each other.

FIG. 22 is a schematic diagram showing a structure of a separating device that separates the panel complex PC and the mother substrate MG from each other. FIG. 23 is a cross-sectional view showing the mother substrate MG and the panel complex PC being bent toward a side in the third direction by the separating device. FIG. 24 is a cross-sectional view showing a releasing knife K disposed between the mother substrate MG and the panel complex PC. FIG. 25 is an enlarged view of an area D of FIG. 24. FIG. 26 is a schematic diagram showing a process in which the releasing knife separates the mother substrate MG and the panel complex from each other.

Referring to FIG. 22, the separating device PD performing the process of separating the panel complex PC and the mother substrate MG from each other may include an upper stage PD_1 and a lower stage PD_2. Further, when the mother substrate MG is mounted on the separating device PD, the mother substrate MG is inverted by 180°. Thus, the bottom face of the mother substrate MG may face toward a side in the third direction DR3, while the top face of the mother substrate MG may face toward the opposite side in the third direction DR3.

The upper stage PD_1 may suck the bottom face of the mother substrate MG and bend the edge of the mother substrate MG toward a side in the third direction DR3. The upper stage PD_1 may be disposed at a side in the third direction DR3 of the separating device PD. The upper stage PD_1 may include a sucker PD_1a and a picker PD_1b.

The sucker PD_1a sucks and fixes the mother substrate MG. The sucker PD_1a may be disposed on and overlap, in the third direction DR3, the bottom face of the mother substrate MG except for an edge thereof. A width in the second direction DR2 of the sucker PD_1a may overlap a substantial portion of a width in the second direction DR2 of the mother substrate MG. For example, the width in the second direction DR2 of the sucker PD_1a may correspond to about 80% or greater of the width in the second direction DR2 of the mother substrate MG. The disclosure is not limited thereto. The width in the second direction DR2 of the sucker PD_1a may vary based on the type of the mother substrate MG. The sucker PD_1a may use vacuum adsorption in which vacuum is used to suck the mother substrate MG. The disclosure is not limited thereto.

The picker PD_1b may bend the edge of the mother substrate MG toward a side in the third direction DR3. Each of the pickers PD_1b may be spaced apart from the sucker PD_1a by a predefined spacing toward each of the opposing sides in the second direction DR2. Both of the pickers PD_1b may overlap with a portion of each of the opposing edges in the second direction DR2 of the mother substrate MG in the third direction DR3. Each picker PD_1b may be spaced apart from the sucker PD_1a by about 15 mm to about 20 mm. The width in the second direction DR2 by which the picker PD_1b and the edge of the mother substrate MG overlap each other may be in a range of about 10 mm to about 15 mm. The picker PD_1b may use vacuum adsorption in which vacuum is used to suck the mother substrate MG. The disclosure is not limited thereto.

The lower stage PD_2 may serve to support the panel complex PC when the panel complex PC is separated from the mother substrate MG. The lower stage PD_2 may be disposed at the opposite side in the third direction DR3 of the separating device PD and may contact the top protective film 1000 of the panel complex PC. The lower stage PD_2 may have a flat surface in an area overlapping the sucker PD_1a, and may have a surface inclined toward the opposite side in the third direction DR3 in an area not overlapping the sucker PD_1a. The disclosure is not limited thereto.

Referring back to FIG. 22, after the process of placing the panel complex PC on the top face of the mother substrate MG has been performed, the mother substrate MG is inverted by 180° and then, the upper stage PD_1 of the separating device PD sucks the bottom face of the mother substrate MG.

Referring to FIG. 23, the pickers PD_1b respectively lift up both opposing edges in the second direction DR2 of the mother substrate MG toward one side in the third direction DR3 such that the mother substrate MG and the panel complex PC are bent toward one side in the third direction DR3. For example, the pickers PD_1b may apply a force to lift up both opposing edges in the second direction DR2 of the sucked mother substrate MG toward a side in the third direction DR3, so that a portion of each of the mother substrate MG and the panel complex PC portion is bent toward a side in the third direction DR3.

In an example, the force by which the pickers PD_1b lift up both opposing side edges in the second direction DR2 of the mother substrate MG may be constant regardless of the type (or generation) of the mother substrate MG. Therefore, an angle by which the mother substrate MG is bent toward a side in the third direction DR3 may vary depending on the type (or generation) of the mother substrate MG. The angle by which the mother substrate MG is bent toward one side in the third direction DR3 may be in a range of about 5° to about 10°.

As both opposing edges in the second direction DR2 of the mother substrate MG and both opposing edges in the second direction DR2 of the panel complex PC are bent, the releasing knife K which will be described below may be inserted into between the mother substrate MG and the panel complex PC. Thus, the mother substrate MG and the panel complex PC may be separated from each other.

Referring to FIG. 23 and FIG. 24, the releasing knife K is located between the mother substrate MG and the panel complex PC. For example, the releasing knife K may approach the panel complex PC from each of both opposing sides in the second direction DR2, and then may move toward a side in the third direction DR3 and thus may be placed between the mother substrate MG and the panel complex PC. In this way, the releasing knife K may be placed between the mother substrate MG and the panel complex PC regardless of the type (or generation) of the mother substrate MG.

Referring to FIG. 25 and FIG. 26, the releasing knife K may move along the top face of the mother substrate MG bent in the third direction DR3, and thus may be inserted into between the mother substrate MG and the panel complex PC and may separate the panel complex PC from the mother substrate MG.

In an example, a side face of the top protective film 1000 may be formed to have the inclination angle of 5° to 50° as described above due to the bump BP. Thus, the releasing knife K may precisely separate the mother substrate MG and the panel complex PC from each other while not deviating from the panel complex PC. When the bump BP is not present and thus the side face of the top protective film 1000 is not formed at the selected inclination, the releasing knife K may deviate from the panel complex PC, so that the separation of the mother substrate MG from the panel complex PC may not be easily performed.

The releasing knife K may sequentially separate the bump BP, the top protective film 1000, and the mother display panel MPNL from the mother substrate MG while moving along the top face of the mother substrate MG as shown in FIG. 25. Adhesion between the bump BP and the mother substrate MG may be smaller than or equal to about 10 gf/inch$^2$, and adhesion between the top protective film 1000 and the mother substrate MG may be in a range of about 3 to about 10 gf/inch$^2$, and adhesion between the mother display panel MPNL and the mother substrate MG may be smaller than or equal to about 0.1 gf/inch$^2$. When the releasing knife K removes only the bump BP and the top protective film 1000 from the mother substrate MG, the mother substrate MG and the mother display panel MPNL may not be separated due to the adhesion between the mother display panel MPNL and the mother substrate MG. Therefore, in order to separate the mother display panel MPNL from the mother substrate MG, the releasing knife K may move along the top protective film 1000 and then may reach a portion of the mother display panel MPNL and then may separate the panel complex PC from the mother substrate MG. The adhesion between the mother display panel MPNL and the mother substrate MG is relatively insignificant. Thus, when the portion of the mother display panel MPNL is removed from the mother substate, the mother substrate MG and the mother display panel MPNL may be easily and entirely separated from each other.

In an example, adhesion between the bump BP and the top protective film 1000 may be about 10 gf/inch$^2$, and adhesion between the top protective film 1000 and the mother display panel MPNL may be about 5 gf/inch$^2$ or smaller. Therefore, the entire panel complex PC may be separated from the mother substrate MG due to the adhesion between the bump BP and the top protective film 1000 and the adhesion between the top protective film 1000 and the mother display panel MPNL.

After the mother substrate MG and the panel complex PC have been removed from each other, the mother display panel MPNL should be scribed on a display panel PNL basis, and the top protective film 1000 should be removed from the top face of the display panel PNL in order to perform the process on a module basis to obtain the display device 1. Hereinafter, the process of scribing the mother display panel MPNL corresponding to the mother substrate MG to obtain the display panel PNL and the process of separating the top protective film 1000 disposed on the obtained display panel PNL will be described in detail.

Figure 27:
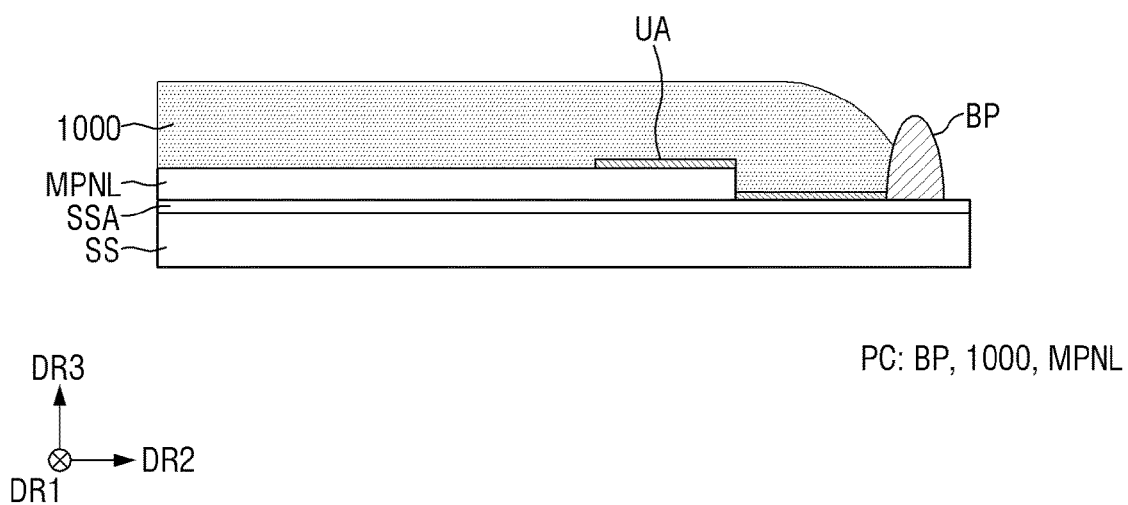
FIG. 27 is a schematic cross-sectional view showing a state where a lower support is attached to a bottom of the panel complex.
Figure 28:
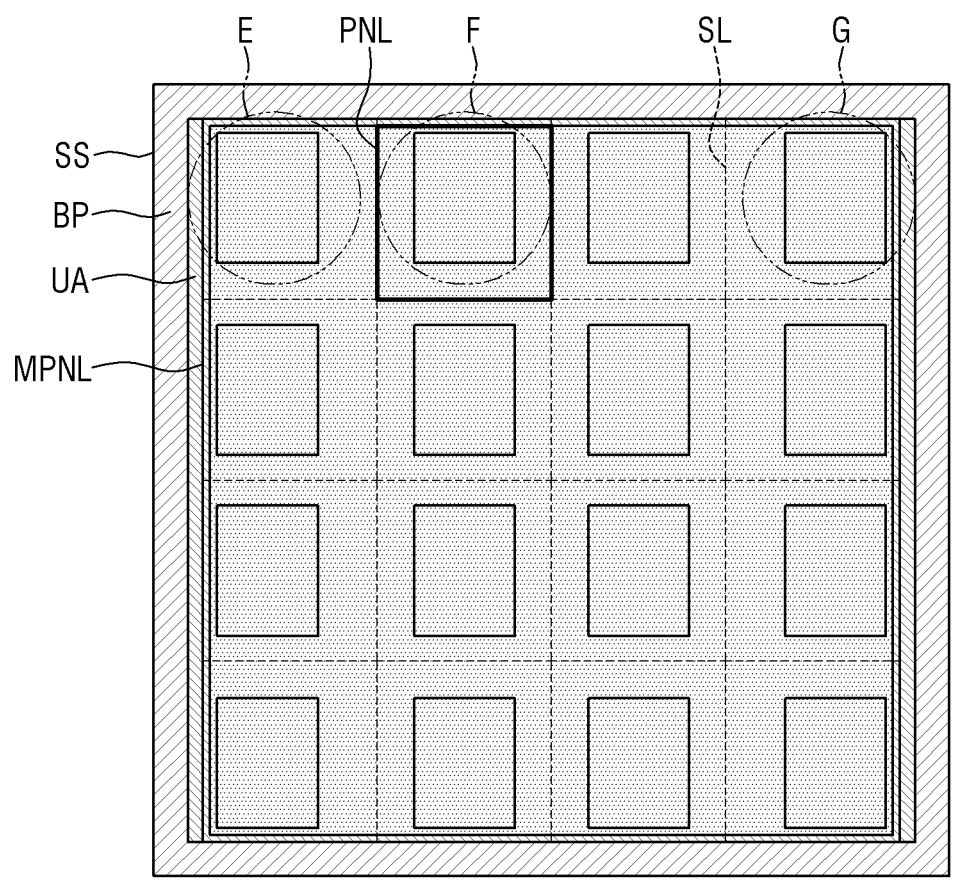
FIG. 28 is a schematic diagram showing a process of scribing the mother display panel to obtain a display panel.
Figure 28:
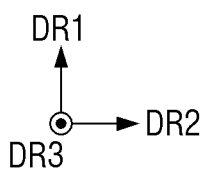
Figure 29:
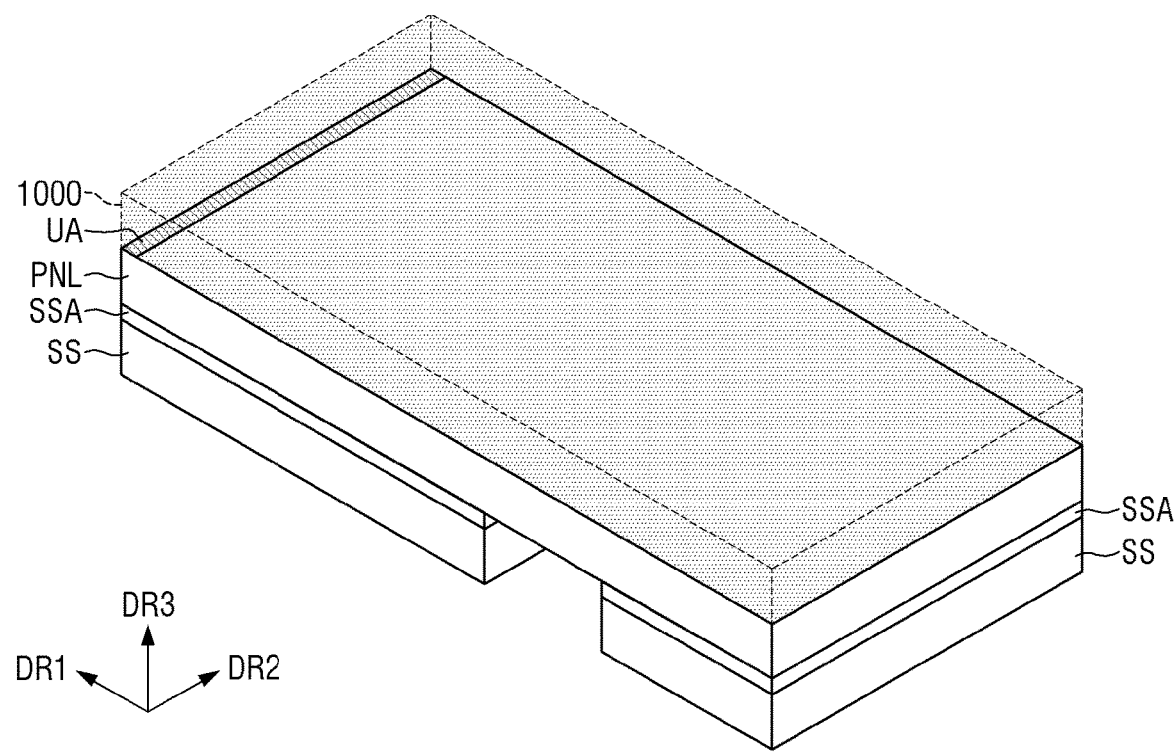
FIG. 29 is a schematic diagram showing a structure of the obtained display panel.
Figure 30:
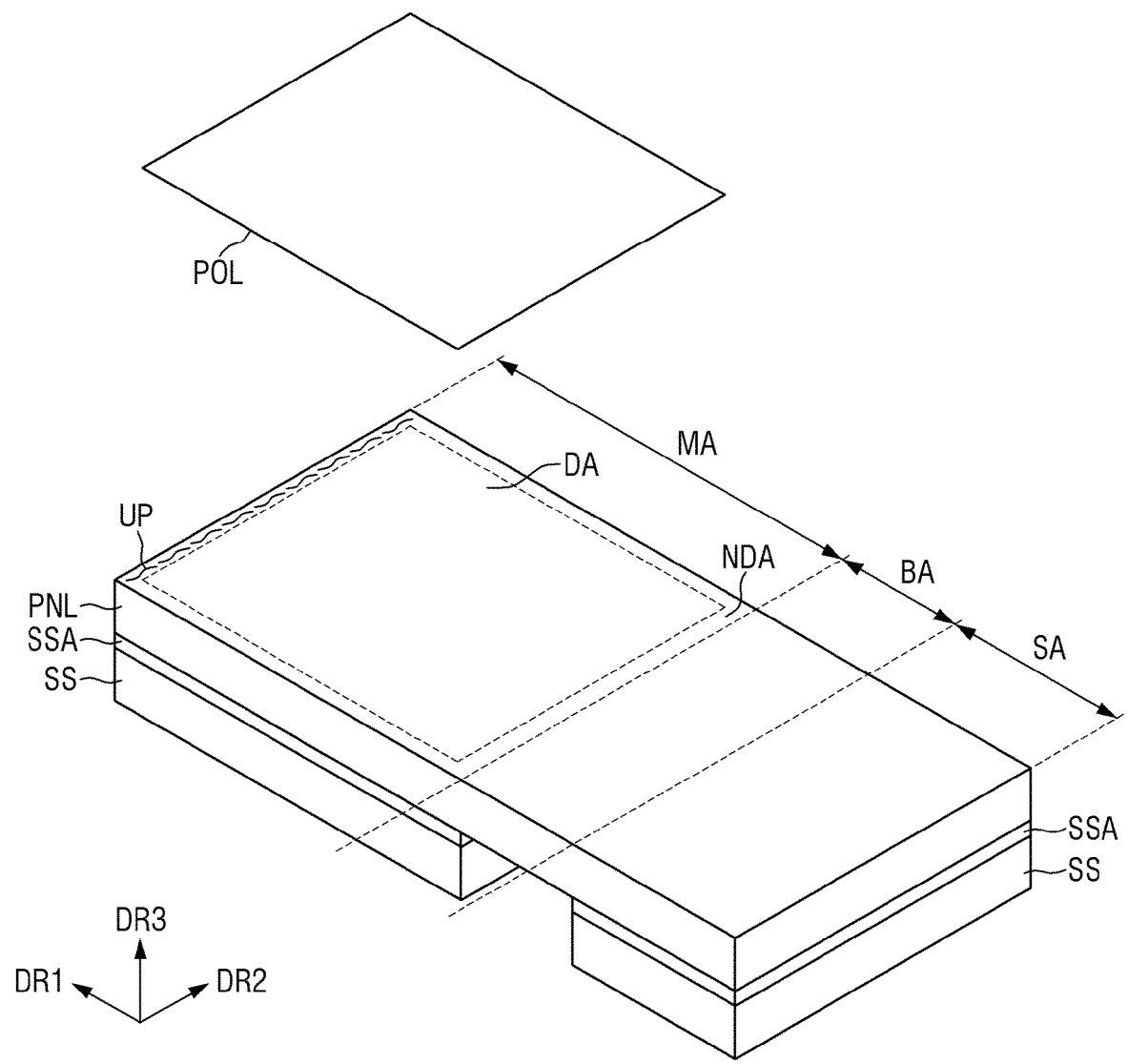
FIG. 30 is a schematic diagram showing a process of removing the top protective film from the obtained display panel top face and attaching aa polarization member thereto.

FIG. 27 is a cross-sectional view showing a lower support SS attached to a bottom of the panel complex PC. FIG. 28 is a schematic diagram showing a process of scribing the mother display panel to obtain a display panel. FIG. 29 is a schematic diagram showing a structure of the obtained display panel PNL. FIG. 30 is a schematic diagram showing a process of separating the top protective film 1000 from the top face of the obtained display panel PNL and attaching the polarization member POL to the display panel PNL.

Referring to FIG. 27, the panel complex PC which has been inverted by 180° in the separating process is inverted again by 180° and returns to the original state after the separating process. A lower support SS is attached to a bottom of the panel complex PC that has returned to the original state.

The lower support SS may support the bottom of the mother display panel MPNL to improve mechanical strength thereof. The lower support SS may be disposed on the bottom of the panel complex PC. The disclosure is not limited thereto. For example, the lower support SS may only be disposed on a bottom face of the mother display panel MPNL.

The lower support SS may be attached to the bottom face of the mother display panel MPNL via a lower support adhesive layer SSA. The lower support adhesive layer SSA may be made of a pressure-sensitive adhesive (PSA) but is not limited thereto.

Referring to FIG. 28 and FIG. 29, the scribing step on the mother display panel MPNL is performed to obtain the display panel PNL. The process of obtaining the display panel PNL may use a laser. For example, the laser may be irradiated to the scribing line SL and thus the mother display panel MPNL, the top protective film 1000 and the lower support SS may be scribed along the scribing line, such that the display panel PNL may be obtained.

The bump BP may not be disposed on the display panel PNL to be obtained. For example, when the scribing is performed along the scribing line SL to obtain the display panel PNL, the bump BP and the display panel PNL may be separated from each other.

The face at a side in the third direction DR3 of the display panel PNL may be defined as a top face thereof on which the top protective film 1000 is disposed. A face at the opposite side in the third direction DR3 of the display panel PNL may be defined as a bottom face thereof on which the lower support SS is disposed.

The lower support SS may overlap only the main area MA and the sub-area SA of each of the display panel MPNL as shown in FIG. 30. The lower support SS scribed and left on the bottom face of the display panel PNL in the process of obtaining the display panel PNL may be flexible so that the lower support may be bent, folded or rolled in an integral manner with the display panel PNL. The lower support SS may be made of polyethylene terephthalate. The disclosure is not limited thereto.

In an example, the display panel PNL may be obtained while the resin pattern UP is formed on one area of the top face of the display panel. For example, referring to FIG. 28, when the display panel PNL of an area E is obtained, the display device 1 in which the resin pattern UP is formed at the position illustrated in FIG. 11 may be obtained. When the display panel PNL of an area F is obtained, the display device 1 in which the resin pattern UP is formed at the position illustrated in FIG. 9 may be obtained. When the display panel PNL of a G area is obtained, the display device 1 in which the resin pattern UP is formed at the position illustrated in FIG. 10 may be obtained. Hereinafter, for convenience of description, following descriptions are based a display panel PNL of the F area.

Referring to FIG. 29 and FIG. 30, the top protective film 1000 disposed on the top face of the scribed display panel PNL is removed, and the polarization member POL is disposed on the main area MA of the display panel PNL. Removal of the top protective film 1000 may be performed using a taping process. For example, a high-adhesion tape may be attached to the top protective film 1000 and the tape may be peeled off from the display panel PNL, thereby removing the top protective film 1000 from the display panel PNL (removing the top protective film 1000 and the display panel PNL from each other).

Adhesion between the top protective film 1000 and the display panel PNL has a value in a range of about 3 gf/inch$^2$ to about 10 gf/inch$^2$. Thus, the tape used to remove the top protective film 1000 may have a higher adhesion value than this value.

The method 2 (not in the drawings) for manufacturing the display device as described above may selectively apply the UV-curable resin UV to adjust the thickness of the top protective film 1000 as needed during the manufacturing process of the display device 1, thereby reducing the amount of a material required for the formation of the top protective film 1000, thereby reducing a material cost.

Hereinafter, other embodiments of the method 2 (not in the drawings) for manufacturing the display device are described. In the following embodiments, the same reference numerals refer to the same component in the previously described embodiment, and redundant descriptions may be omitted or simplified, and the differences will be described.

Figure 31:
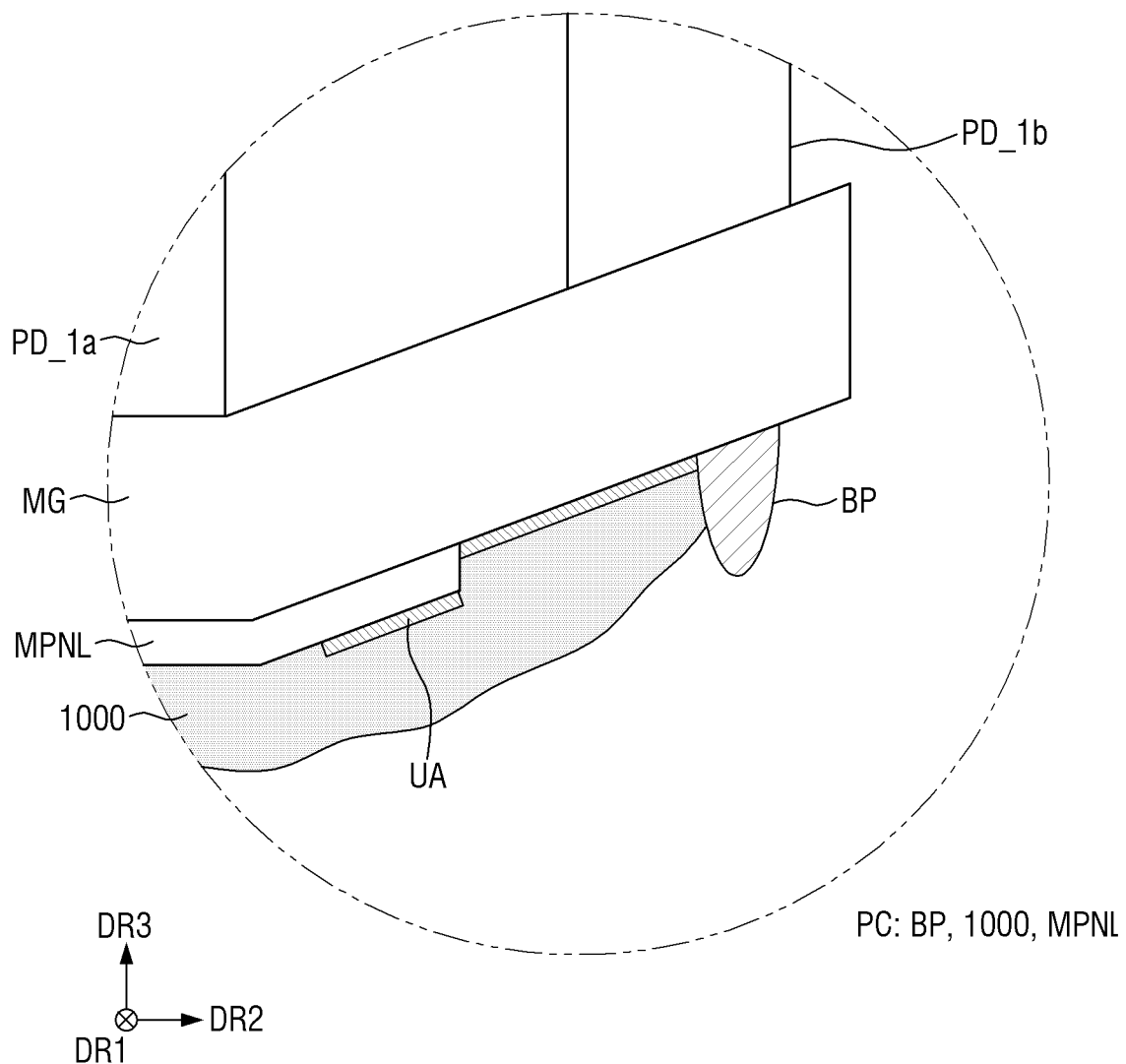
FIG. 31 to FIG. 33 are schematic diagrams showing a mother substrate separating process of a method for manufacturing a display device according to an embodiment.
Figure 32:
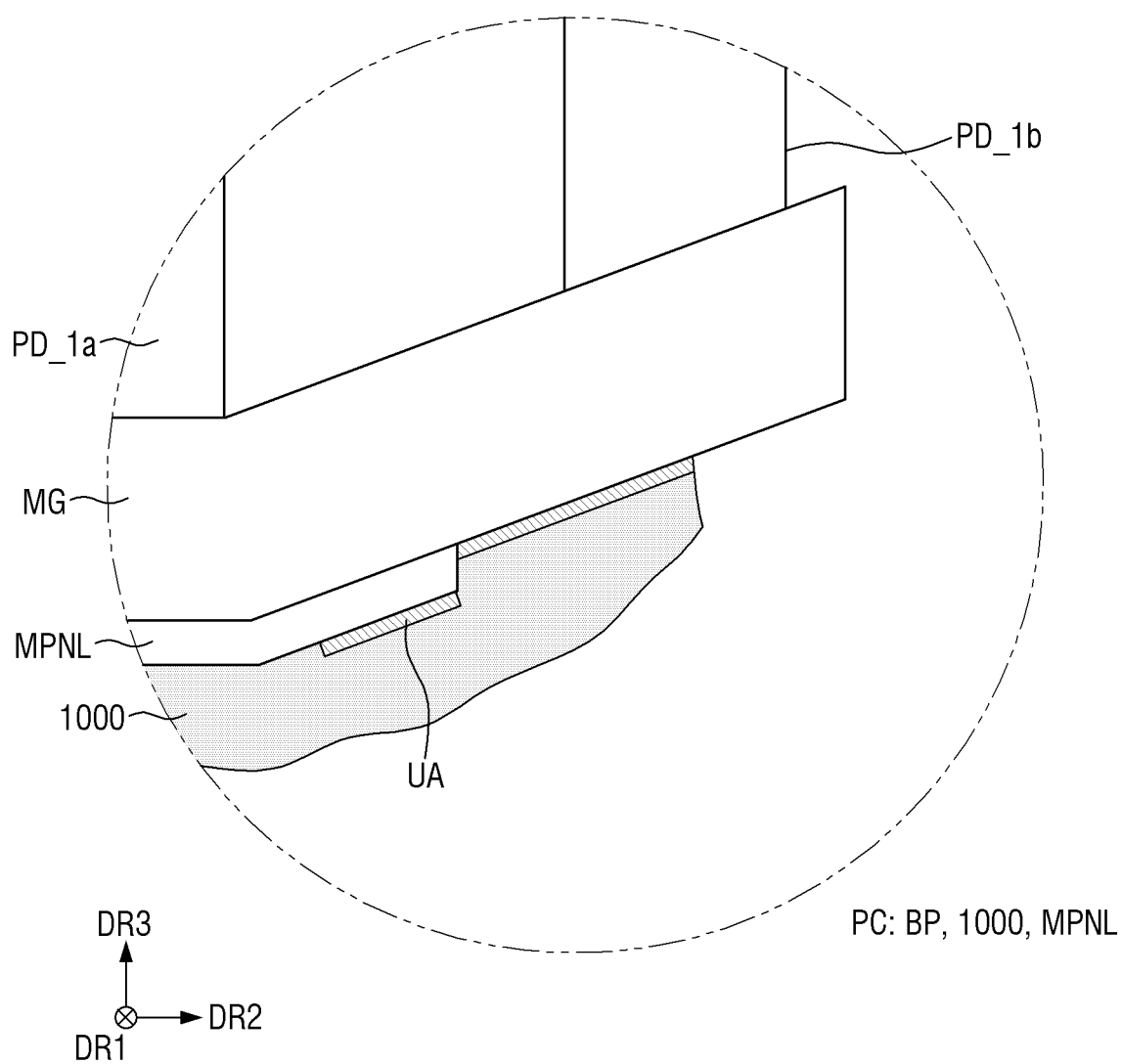
Figure 33:
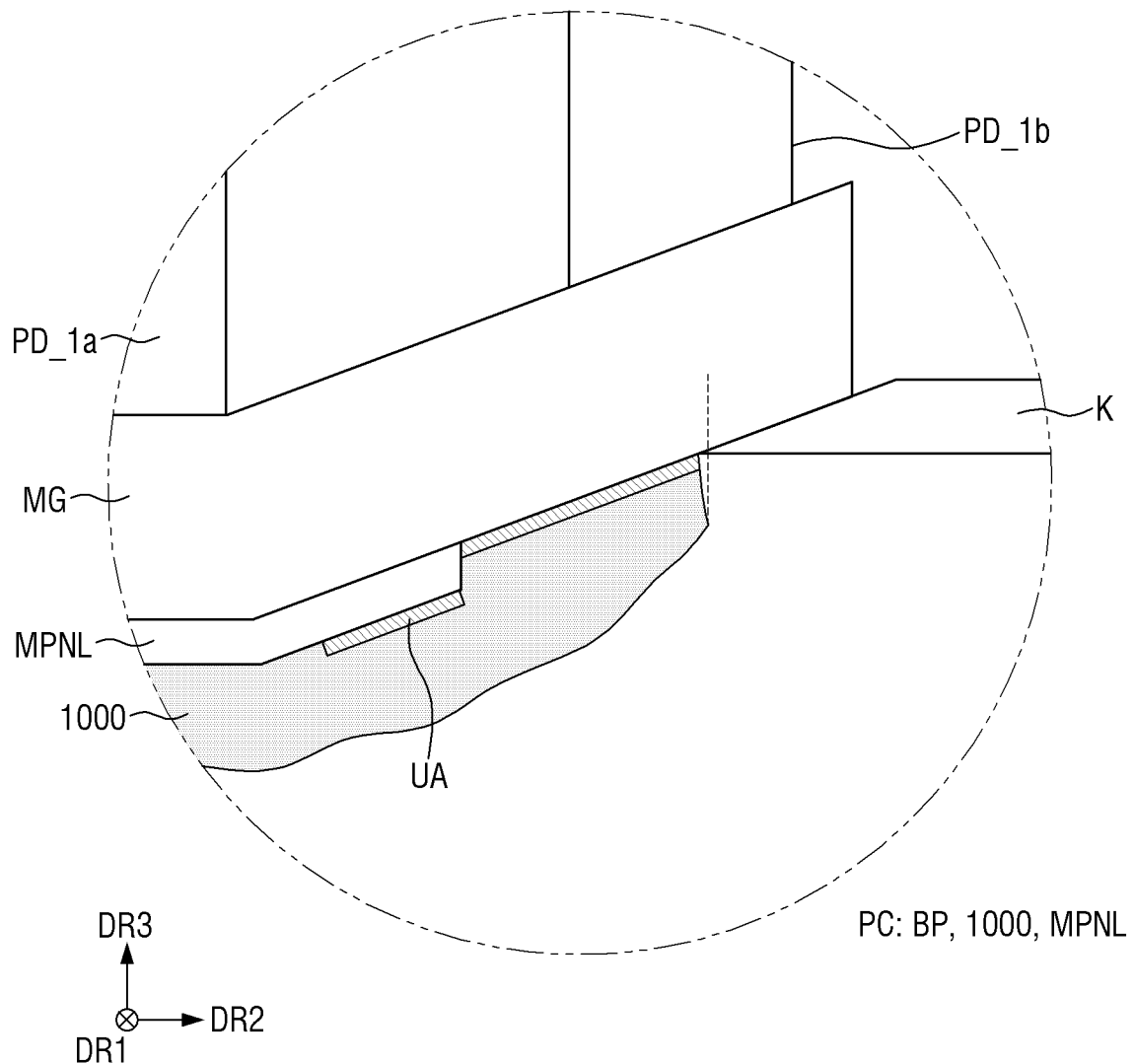

FIG. 31 to FIG. 33 are schematic diagrams showing a mother substrate separating process of a method for manufacturing a display device according to an embodiment.

Referring to FIG. 31 to FIG. 33, in a method 2_1 (not in the drawings) for manufacturing a display device according to an embodiment, the releasing knife K may be inserted between the top protective film 1000 and the mother substrate MG after the bump BP has been removed during the process of separating the mother substrate MG.

The bump BP may be separated from the mother substrate MG and the top protective film 1000 before the releasing knife K is inserted into between the top protective film 1000 and the mother substrate MG, as shown in FIG. 31 and FIG. 32. The separation of the bump BP may be performed using a taping process. As described above, the adhesion between the bump BP and the mother substrate MG may be about 10 gf/inch$^2$ and the adhesion between the bump BP and the top protective film 1000 may be about 10 gf/inch$^2$, and thus adhesion of the tape used to remove the bump BP may be equal to or greater than about 10 gf/inch$^2$.

The bump BP and the top protective film 1000 may be made of different materials. When the bump BP and the top protective film 1000 are made of the same material, the bump BP and the top protective film 1000 may be integrally formed into a single body and thus adhesion between them may be very large. For this reason, when the bump BP and the top protective film 1000 are made of different materials, the adhesion between the bump BP and the top protective film 1000 may be reduced.

Referring to FIG. 33, after the bump BP has been removed from the top protective film, the top protective film 1000 may have the same shape as that of a boundary face of the removed bump BP. When the releasing knife K is inserted to the top protective film 1000, the top protective film 1000 may have a reverse-tapered shape that wraps around the releasing knife K. For example, the inclination of the top protective film 1000 at a portion thereof to which the releasing knife K is inserted is about 90° or greater, so that the portion may surround the releasing knife K. Accordingly, the releasing knife K may easily separate the mother substrate MG and the display panel PNL from each other while not deviating from the top protective film 1000.

Figure 34:
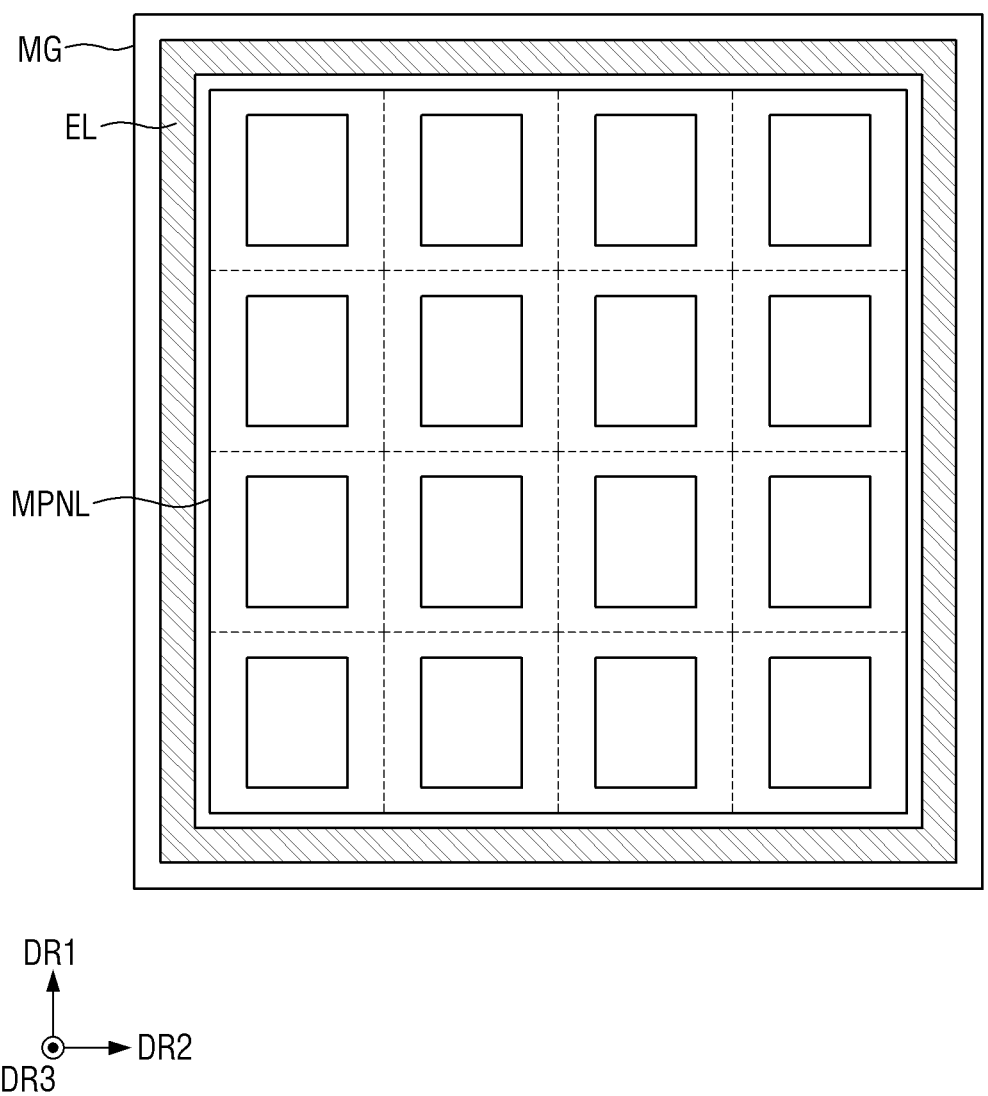
FIG. 34 and FIG. 35 are schematic diagrams showing a bump forming process of a method for manufacturing a display device according to an embodiment.
Figure 35:
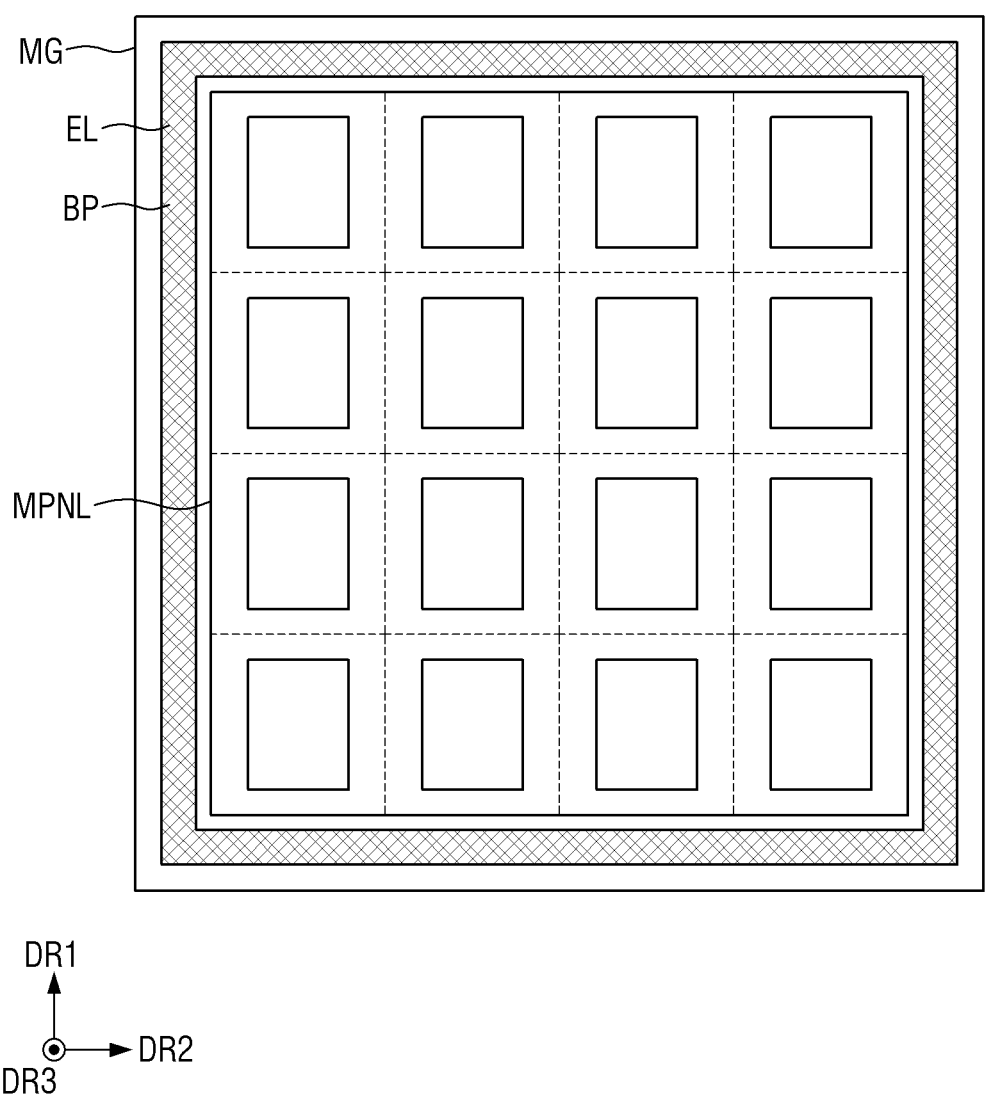
Figure 36:
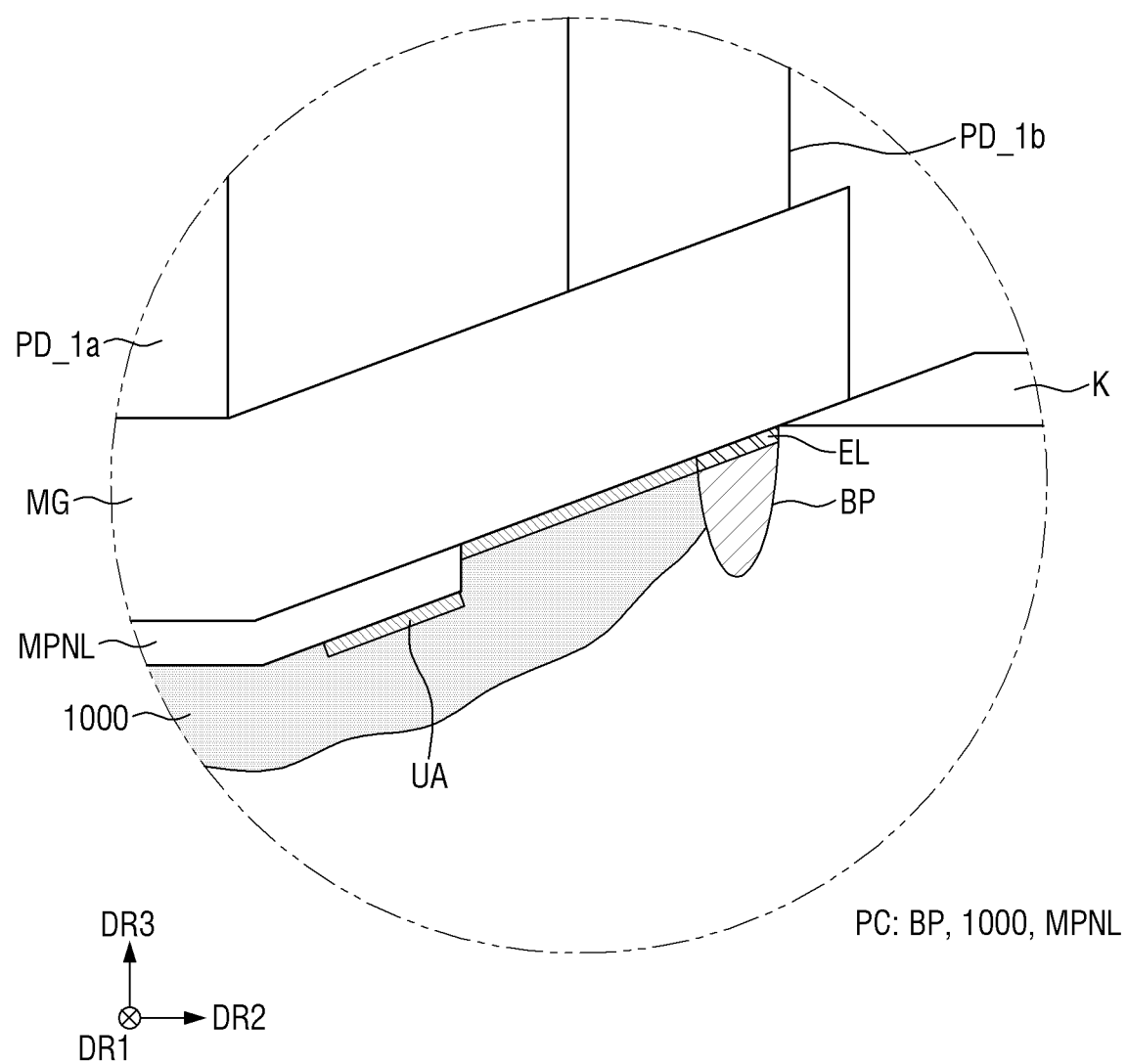
FIG. 36 is a schematic diagram showing a mother substrate separating process of the method for manufacturing the display device according to the embodiment of FIG. 34 and FIG. 35.

FIG. 34 and FIG. 35 are schematic diagrams showing a bump forming process of a method for manufacturing a display device according to an embodiment. FIG. 36 is a schematic diagram showing a mother substrate separating process of the method for manufacturing the display device according to the embodiment of FIG. 34 and FIG. 35.

Referring to FIG. 34 to FIG. 36, in a method 2_2 (not in the drawings) for manufacturing the display device according to an embodiment, a foam layer EL may be formed between the bump BP and the mother substrate MG.

The foam layer EL may reduce the adhesion between the bump BP and the mother substrate MG. The foam layer EL may be further disposed between the bump BP and the mother substrate MG. Referring to FIG. 32 to FIG. 33, the foam layer EL may be disposed on the top face of the mother substrate MG so that the foam layer overlaps the bump BP in the third direction DR3 (in a plan view).

The foam layer EL may produce bubbles when the foam layer receives a laser with a wavelength of about 308 nm to about 343 nm. The laser irradiated toward the foam layer EL may pass through the bottom face of the mother substrate MG and may be irradiated to the foam layer EL. The laser irradiated to the foam layer EL may be irradiated before the process of separating the mother substrate MG and the panel complex PC from each other is performed, thereby producing the bubbles in the foam layer EL. The foam layer EL may include, for example, gallium nitride (GaN). The disclosure is not limited thereto.

Referring to FIG. 36, the bubbles may be produced in the foam layer EL disposed between the bump BP and the mother substrate MG, thereby weakening the adhesion between the bump BP and the mother substrate MG. Accordingly, the separation between the mother substrate MG and the panel complex PC may be facilitated.

Figure 37:
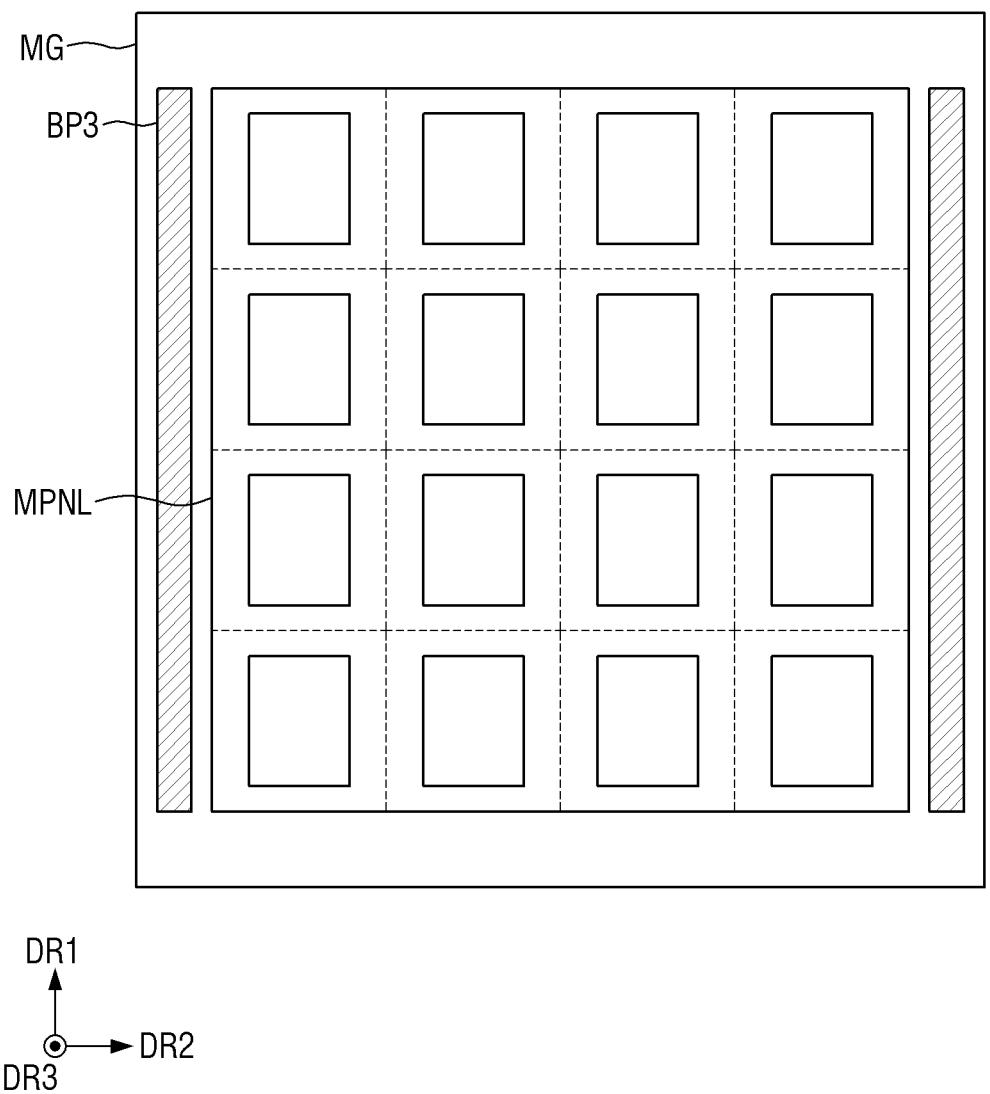
FIG. 37 is a schematic diagram showing a bump forming process of a method for manufacturing a display device according to an embodiment.

FIG. 37 is a schematic diagram showing a bump forming process of a method for manufacturing a display device according to an embodiment.

Referring to FIG. 37, in a method 2_3 (not in the drawings) for manufacturing the display device according to an embodiment, a bump BP3 may be disposed only adjacent to each of the opposing sides in the second direction DR2 of the mother display panel MPNL. The bump BP3 according to an embodiment may be disposed on a top face of the mother substrate MG and at a position spaced, by about 700 μm to about 1300 μm, from each of the opposing sides in the second direction DR2 of the mother display panel MPNL. A length in the first direction DR1 of the bump BP3 may be the same as the length in the first direction DR1 of each of the opposing sides in the second direction DR2 of the mother display panel MPNL.

Figure 38:
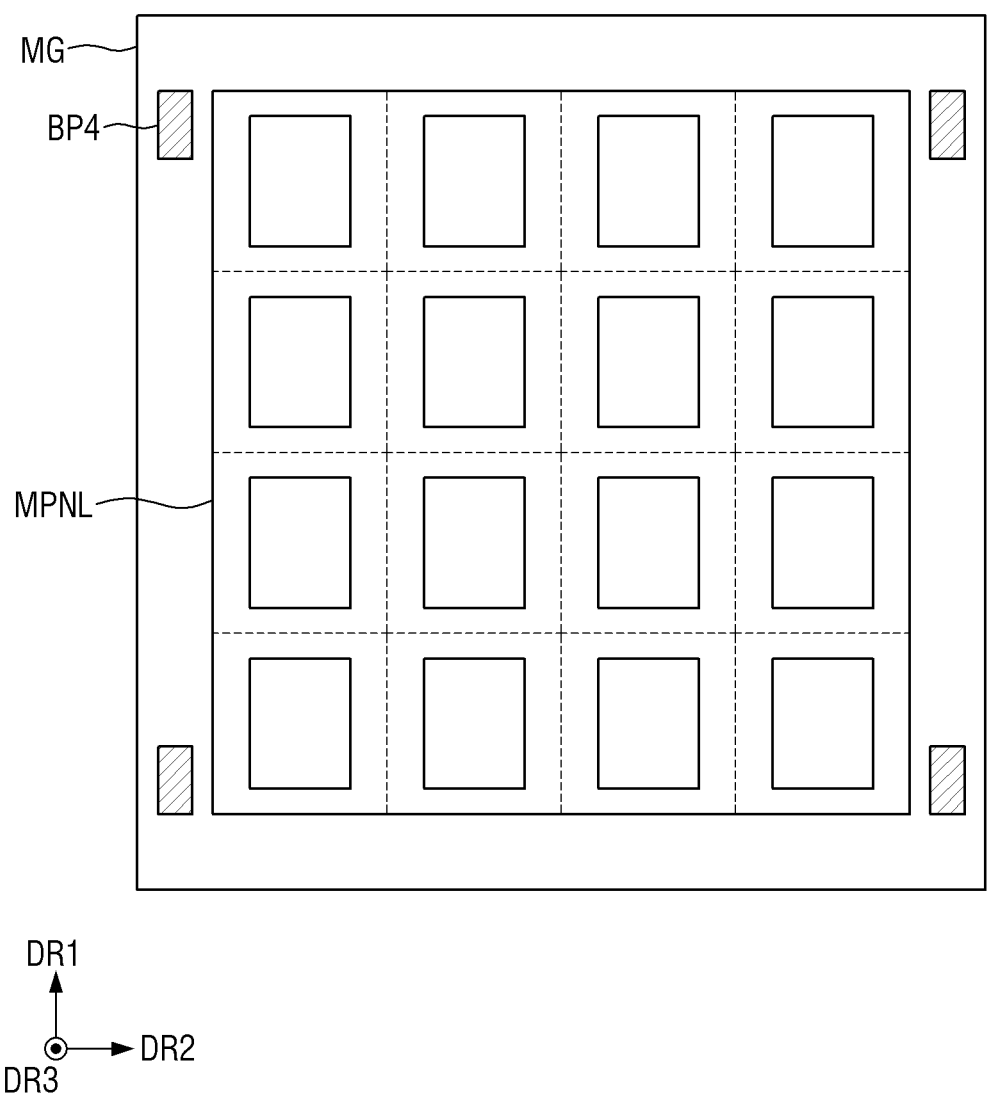
FIG. 38 is a schematic diagram showing a bump forming process of a method for manufacturing a display device according to an embodiment.

FIG. 38 is a schematic diagram showing a bump forming process of a method for manufacturing a display device according to an embodiment.

Referring to FIG. 38, a method 2_4 (not in the drawings) for manufacturing the display device according to an embodiment is different from the method 2_3 (not in the drawings) of FIG. 37 in that two bumps BP4 are disposed adjacent to each of the opposing sides in the second direction DR2 of the mother display panel MPNL at an end in the first direction DR1. Another pair of bumps BP4 are spaced from each other and are disposed at the opposing ends in the first direction DR1. A width in the first direction DR1 of the bump BP4 may be about 500 µm or greater. The disclosure is not limited thereto.

Figure 39:
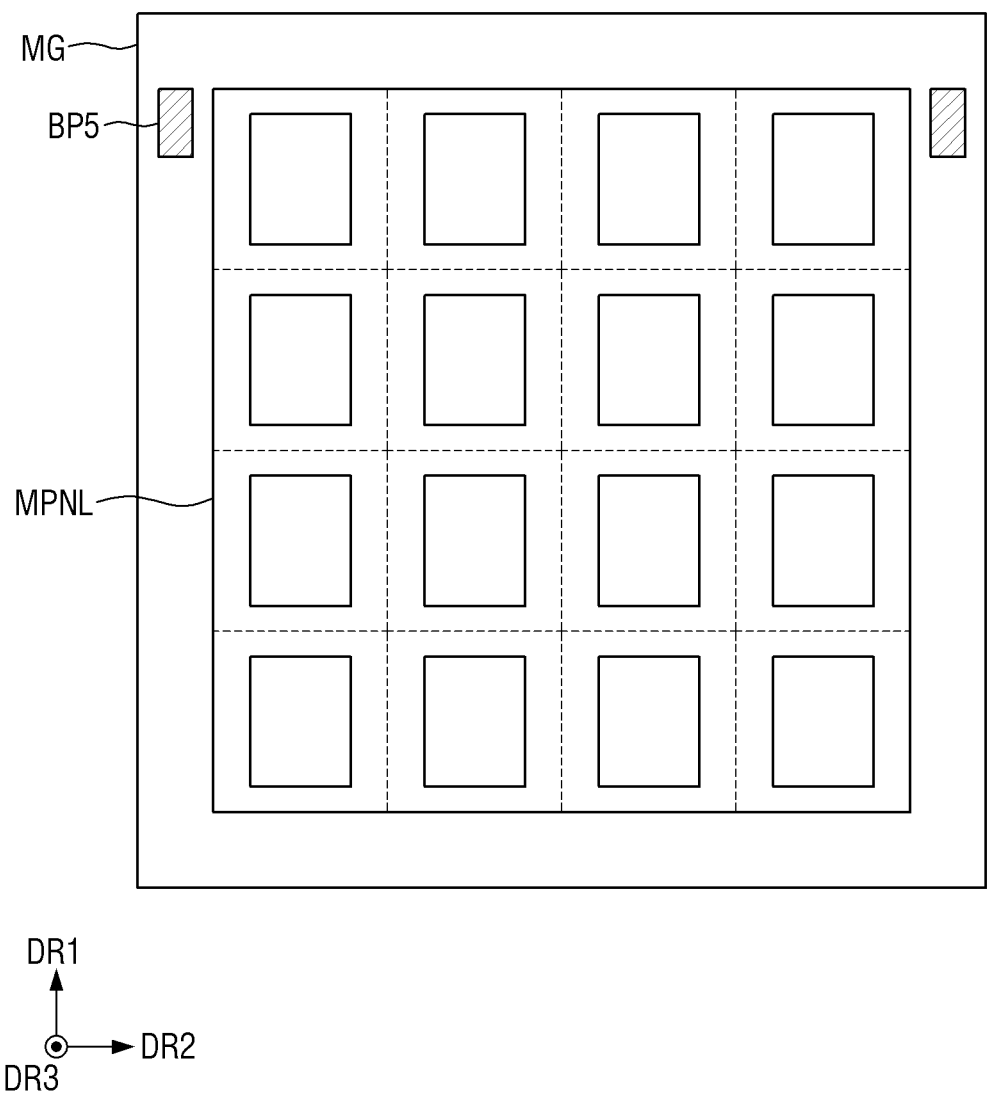
FIG. 39 is a schematic diagram showing a bump forming process of a method for manufacturing a display device according to an embodiment.

FIG. 39 is a schematic diagram showing a bump forming process of a method for manufacturing a display device according to an embodiment.

Referring to FIG. 39, a method 2_5 (not in the drawings) for manufacturing the display device according to an embodiment is different from the method 2_4 (not in the drawings) for manufacturing the display device according to the embodiment of FIG. 38 in that two bumps BP5 are respectively disposed adjacent to the opposing sides in the second direction DR2 of the mother display panel MPNL and the bumps BP 5 are disposed only at one end in the first direction DR1.

Figure 40:
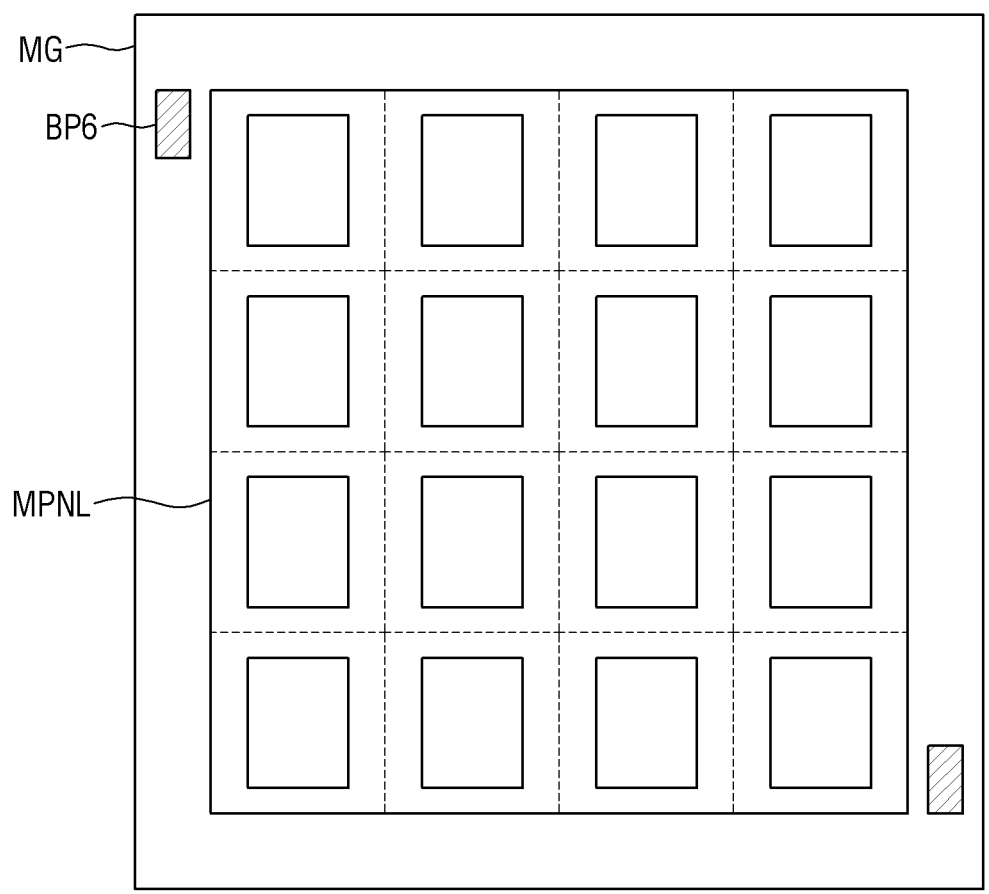
FIG. 40 is a schematic diagram showing a bump forming process of a method for manufacturing a display device according to an embodiment.

FIG. 40 is a schematic diagram showing a bump forming process of a method for manufacturing a display device according to an embodiment.

Referring to FIG. 40, a method 2_6 (not in the drawings) for manufacturing the display device according to an embodiment is different from the method 2_5 (not in the drawings) for manufacturing the display device according to the embodiment of FIG. 39 in that two bumps BP6 are respectively disposed adjacent to opposing sides in the second direction DR2 of the mother display panel MPNL. One of the two bumps BP6 is disposed at a side end in the first direction DR1 of the mother display panel MPNL, and the other bump BP6 is disposed at the opposite side end in the first direction DR1 the mother display panel MPNL (the two bumps BP6 are disposed diagonally from each other with respect to the mother display panel MPNL).

Figure 41:
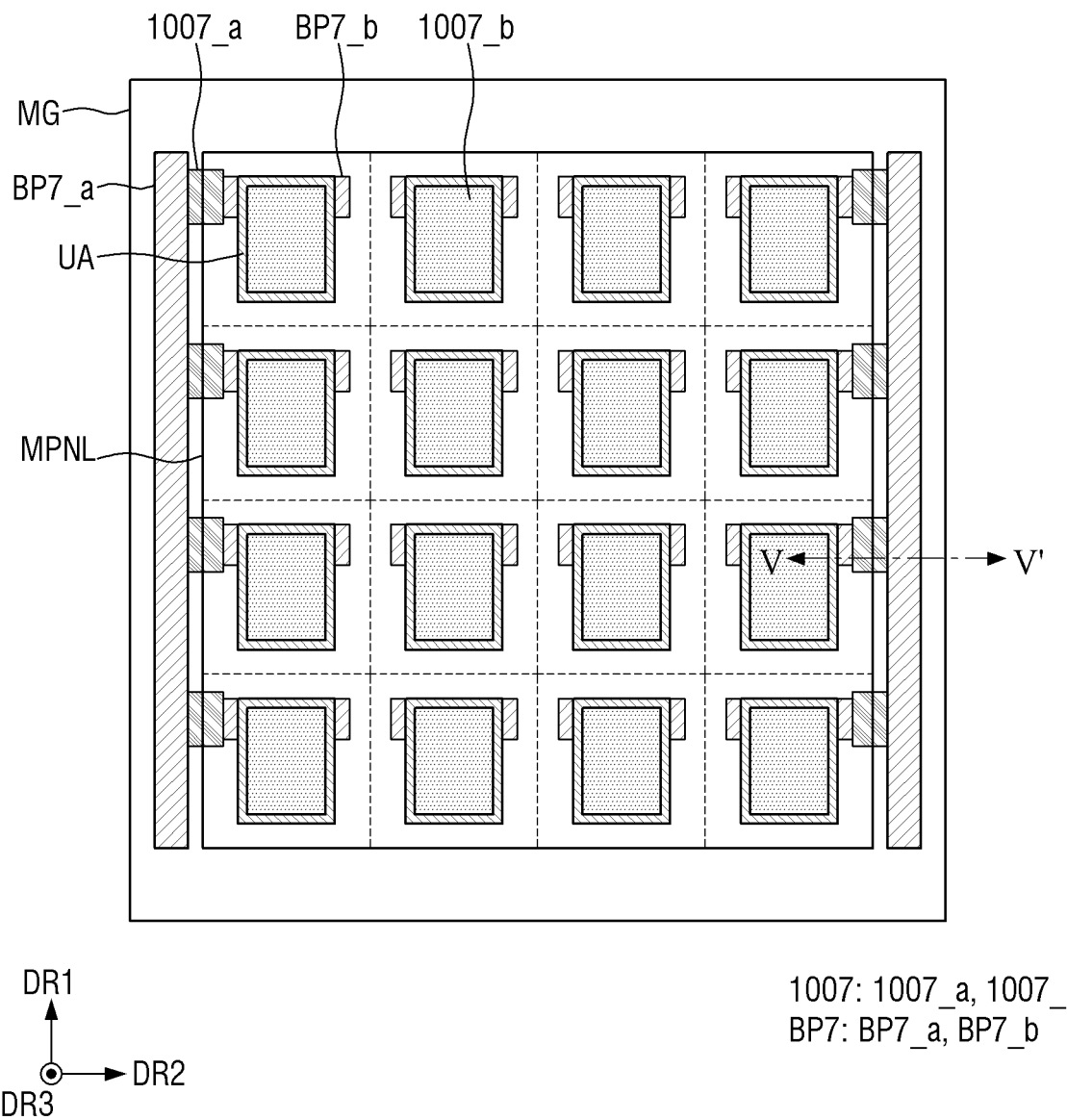
FIG. 41 is a schematic diagram schematically showing a process of forming the top protective film in a method for manufacturing a display device according to an embodiment.
Figure 42:
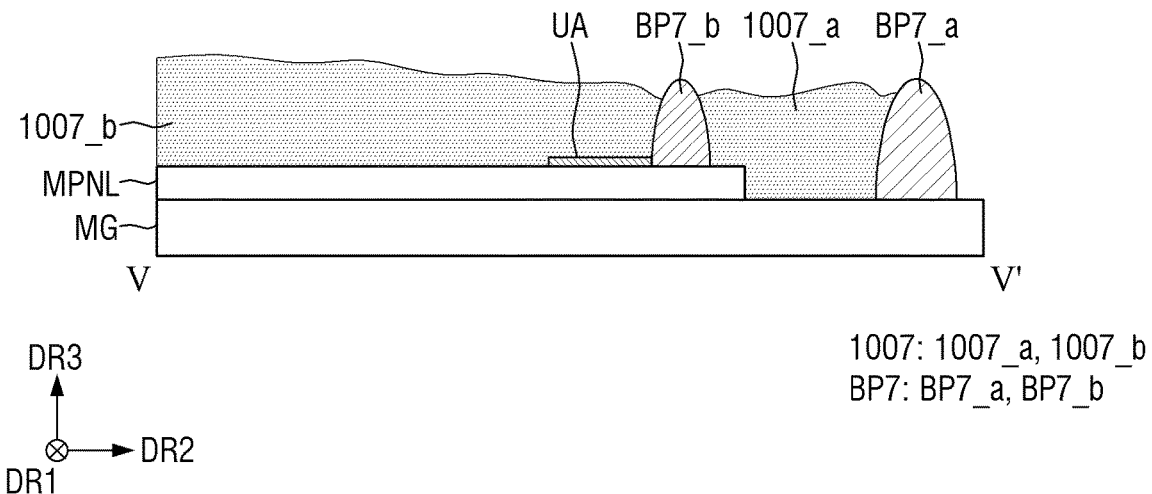
FIG. 42 is a cross-sectional view showing a cross-section of the mother substrate of FIG. 41 as cut along a line IV-IV.
Figure 43:
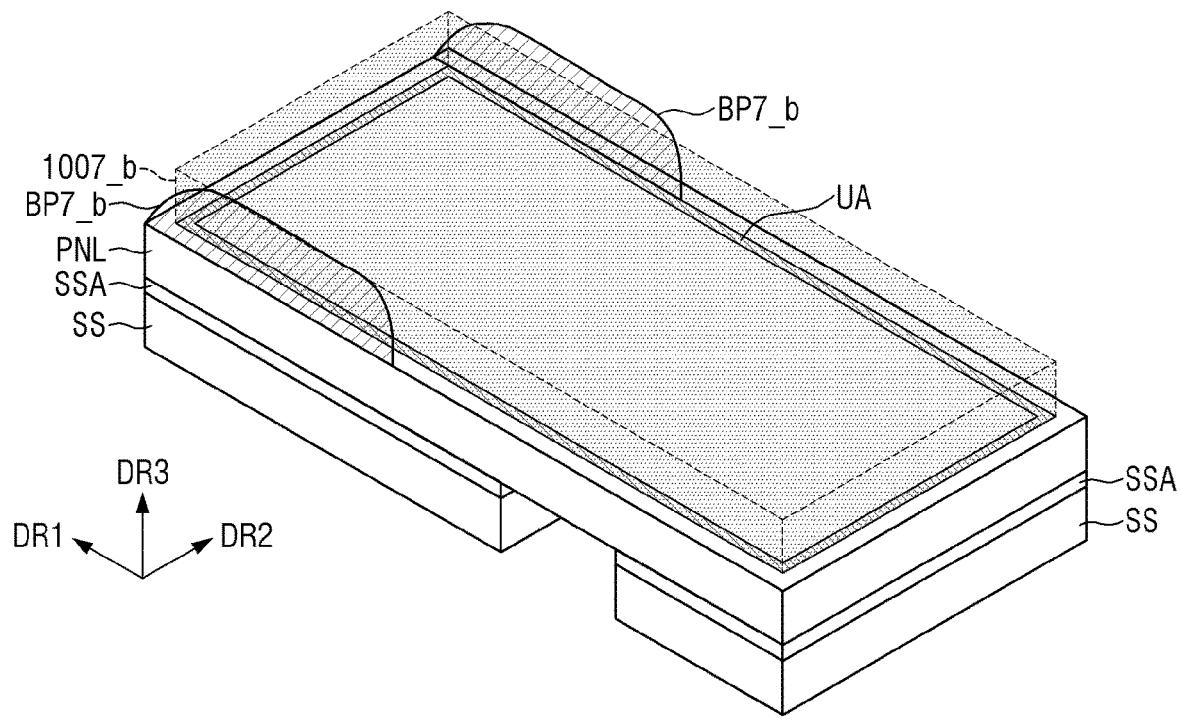
FIG. 43 is a schematic diagram showing a structure of a display panel obtained using the method for manufacturing the display device according to the embodiment of FIG. 41.
Figure 44:
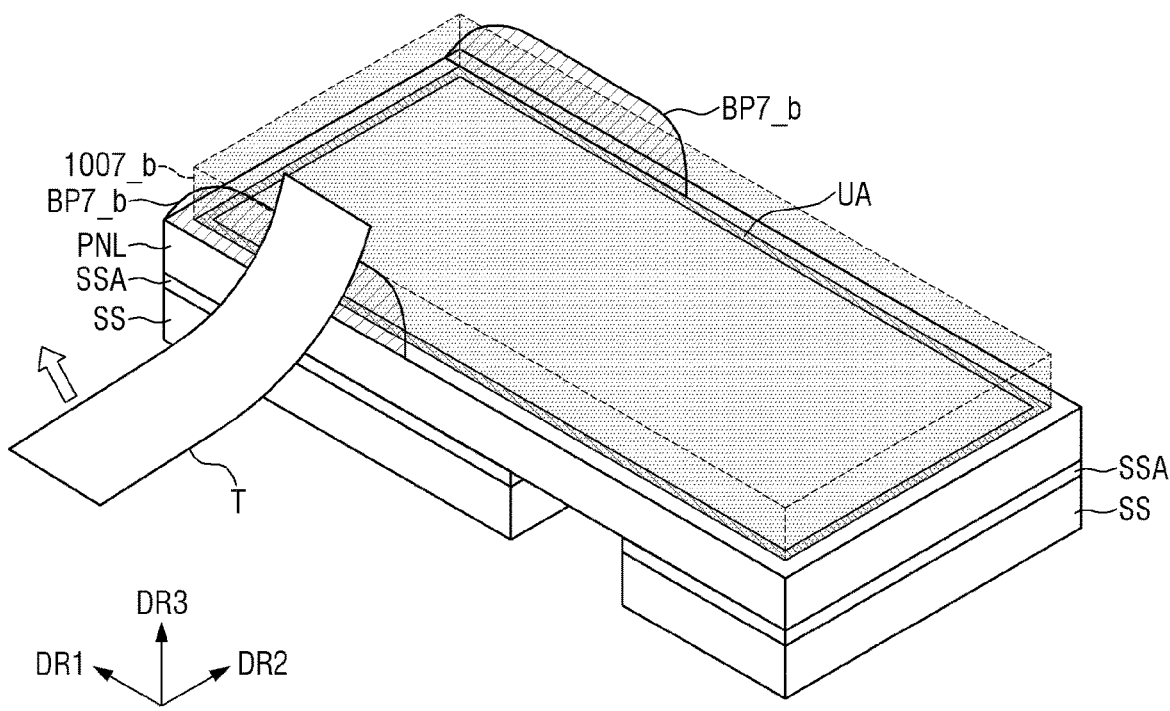
FIG. 44 and FIG. 45 are schematic diagrams showing a process of separating a display panel and a protective portion of FIG. 43 from each other.
Figure 45:
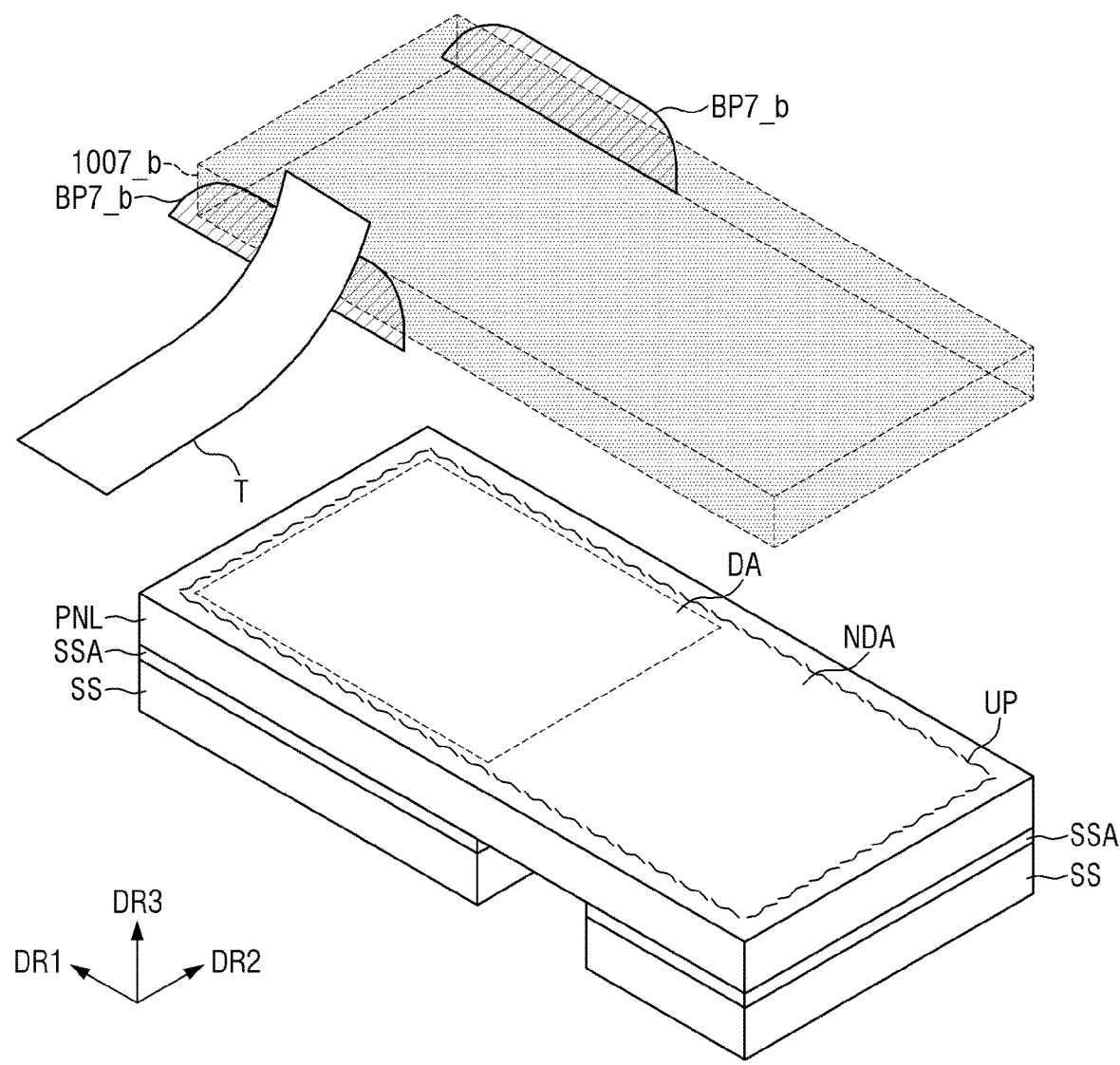

FIG. 41 is a schematic diagram showing a process of forming the top protective film of a method for manufacturing a display device according to an embodiment. FIG. 42 is a cross-sectional view showing a cross-section of the mother substrate of FIG. 41 as cut along a line V-V. FIG. 43 is a schematic diagram showing a structure of a display panel obtained via the method for manufacturing the display device according to the embodiment of FIG. 41. FIG. 44 and FIG. 45 are schematic diagrams showing a process of separating the display panel PNL and a protective portion 1007_b of FIG. 43 from each other.

Referring to FIG. 41 to FIG. 43, in a method 2_7 (not in the drawings) for manufacturing the display device according to an embodiment, a top protective film 1007 may be applied only onto an area of the mother display panel MPNL in which the display panel PNL is finally left after the process on a module basis.

A bump BP7 according to an embodiment may include a first bump BP7_a and a second bump BP7_b.

The first bump BP7_a may serve to facilitate the separation between the mother display panel MPNL and the mother substrate MG. The first bump BP7_a may be disposed in a second area MG_2 of the mother substrate MG and may be spaced apart by about 700 µm to about 1300 µm, from each of the opposing sides in the second direction DR2 of the mother display panel MPNL. The disclosure is not limited thereto. A width in the first direction DR1 of the first bump BP7_a may be the same as a width in the first direction DR1 of each of both opposing sides in the second direction DR2 of the mother display panel MPNL. The disclosure is not limited thereto.

The second bump BP7_b may help separate a protective portion 1007_B of the top protective film 1007 (to be described below) from the display panel PNL. The second bump BP7_b may be disposed at each of the display panels PNL. The second bump BP7_b may be spaced apart from each of the opposing edges in the second direction DR2 of an area where the display panel PNL may be finally left after processing on a module basis in an area of the display panel PNL by about 500 µm or smaller. Two second bumps BP7_b may be allocated to each of the display panels PNL. The disclosure is not limited thereto. A width in the first direction DR1 of the second bump BP7_b may be about 500 µm or greater. The disclosure is not limited thereto.

The top protective film 1007 according to an embodiment may include a connective portion 1007_a and the protective portion 1007_b.

The connective portion 1007_a may connect the first bump BP7_a, the mother substrate MG, the mother display panel MPNL, and the second bump BP7_b to each other and thus facilitate the separation of the mother substrate MG and the mother display panel MPNL. The connective portion 1007_a may be disposed between the first bump BP7_a and the second bump BP7_b. The connective portion 1007_a may be formed in an area from the opposite side face in the second direction DR2 of the first bump BP7_a to a side face in the second direction DR2 of the second bump BP7_b as shown in FIG. 42. The connective portion 1007_a may cover an exposed portion of the top face of the mother display panel MPNL and an exposed portion of the top face of the mother substrate MG between the first bump BP7_a and the second bump BP7_b, but may not cover an end in the third direction DR3 of the second bump BP7_b. The disclosure is not limited thereto. For example, the connective portion 1007_a may cover an end in the third direction DR3 of the second bump BP7_b and may be connected to the protective portion 1007_b.

The protective portion 1007_b may prevent defects such as scratches that may occur in an area in which the display panel PNL is finally left after the processing on a module basis in an area of the display panel PNL while the mother display panel MPNL is transferred from the processing on a mother substrate basis to the processing on a module basis. The protective portion 1007_b may be disposed in the area where the display panel PNL is finally left after the processing on a module basis in an area of each display panel PNL of the top face of the mother display panel MPNL.

As shown in FIG. 41, the protective portions 1007_b of the display panels PNL may not be integrally formed with each other. The protective portions 1007_b of adjacent display panels PNL may be spaced apart from each other while the scribing line SL is positioned between them. The top protective film 1007 may not disposed in a remaining area of the top face of the display panel PNL except for an area where the connective portion 1007_a and the protective portion 1007_b are formed. Thus, the remaining area may be exposed to an outside.

Accordingly, the top protective film 1007 is not formed in the area of the top face of the mother display panel MPNL where preventing scratches is not required. Therefore, the amount of UV-curable resin UV used to form the top protective film 1007 may be relatively reduced. The top protective film 1007 may not be formed on the scribing line SL, such that the scribing may be easily performed when obtaining the display panel PNL.

Referring to FIG. 43, only the protective portion 1007_b of the top protective film 1007 may remain on the top face of the display panel PNL obtained via the scribing process. When the display panel PNL is obtained according to the method 2_7 (not in the drawings) for manufacturing the display device according to an embodiment, the display device 1 in which the resin pattern UP is formed in the position illustrated in FIG. 12 may be obtained.

Referring to FIG. 44 and FIG. 45, the process of separating the protective portion 1007_*b* from the display panel PNL may be facilitated due to the second bump BP7_*b*. The process of separating the display panel PNL and the protective portion 1007_*b* from each other may be performed via a taping process. Adhesion between the second bump BP7_*b* and the display panel PNL may be about 5 gf/inch$^2$ or smaller, adhesion between the display panel PNL and the protective portion 1007_*b* may be about 5 gf/inch$^2$ or smaller, and adhesion between the second bump BP7_*b* and the protective portion 1007_*b* may be smaller than or equal to about 10 gf/inch$^2$. Thus, a tape T used in the taping process may be attached to the second bump BP7_*b* or the second bump BP7_2 and the protective portion 1007_*b*. When the tape T is peeled off, a combination of the second bump BP7_*b* and the protective portion 1007_*b* may be separated from the display panel PNL due to the adhesion between the second bump BP7_*b* and the protective portion 1007_*b*.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation. Accordingly, it will be understood by those of ordinary skill in the art that various changes in form and details may be made without departing from the spirit and scope of the disclosure as set forth in the following claims.

What is claimed is:

1. A display device comprising:
 a display panel including:
 a light-emitting element layer disposed on a substrate;
 a thin-film encapsulation layer disposed on the light-emitting element layer;
 a touch electrode layer disposed on the thin-film encapsulation layer;
 a display area, the light-emitting element layer being located in the display area in a plan view; and
 a non-display area disposed around the display area in a plan view,
 a resin pattern disposed on and directly contacting the touch electrode layer, the resin pattern including an ultraviolet ray (UV)-curable material, wherein
 the non-display area includes:
 a first non-display area disposed around the display area in a plan view; and
 a second non-display area spaced apart from the display area, the first non-display area being disposed between the display area and the second non-display area in a plan view, and
 the resin pattern is disposed in the second non-display area in a plan view.

2. The display device of claim 1, wherein,
 the touch electrode layer includes:
 a first touch conductive layer disposed on the thin-film encapsulation layer;
 a touch insulating layer disposed on the first touch conductive layer;
 a second touch conductive layer disposed on the touch insulating layer; and
 a touch protective layer disposed on the second touch conductive layer, and the resin pattern is disposed directly on the touch protective layer.

3. The display device of claim 2, wherein an adhesion between the touch protective layer and the resin pattern is in a range of about 3 gf/inch$^2$ to about 5 gf/inch$^2$.

4. The display device of claim 3, further comprising:
 a polarization member disposed on the touch protective layer;
 a window cover disposed on the polarization member; and
 an adhesive layer disposed between the window cover and the polarization member, the adhesive layer attaching the window cover to the polarization member, wherein
 the resin pattern is disposed between the touch protective layer and the polarization member,
 the adhesive layer includes an ultraviolet ray (UV)-curable material, and
 an adhesion between the adhesive layer and the polarization member is greater than the adhesion between the touch protective layer and the resin pattern.

5. The device of claim 1, wherein the second non-display area extends about 300 μm from an edge of the display panel.

6. The display device of claim 5, wherein
 the resin pattern overlaps the thin-film encapsulation layer and the touch electrode layer, and the resin pattern does not overlap the light-emitting element layer.

7. The display device of claim 1, wherein the resin pattern is disposed in the second non-display area in a plan view so as to surround a majority of the display area.

8. A display device comprising:
 a display panel including:
 a circuit layer disposed on a substrate;
 a light-emitting element layer disposed on the circuit layer;
 a thin-film encapsulation layer disposed on the light-emitting element layer;
 a display area, the light-emitting layer being located in the display area in a plan view; and
 a non-display area disposed around the display area in a plan view, and
 a resin pattern disposed on and directly contacting the thin-film encapsulation layer, the resin pattern including an ultraviolet ray (UV)-curable material, wherein
 the non-display area includes:
 a first non-display area arranged around the display area in a plan view, and
 a second non-display area spaced apart from the display area, the first non-display area being disposed between the second non-display area and the display area in a plan view, and
 the resin pattern is disposed in the second non-display area.

9. The display device of claim 8, wherein
 the thin-film encapsulation layer includes:
 a first inorganic layer disposed on the light-emitting element layer;
 an organic layer disposed on the first inorganic layer; and
 a second inorganic layer disposed on the organic layer, and
 the resin pattern is disposed directly on the second inorganic layer.

10. The display device of claim 9, wherein
 the resin pattern overlaps the circuit layer, and the thin-film encapsulation layer in a plan view, and
 the resin pattern does not overlap the light-emitting element layer in a plan view.

* * * * *